United States Patent
Yamada

(10) Patent No.: US 10,479,931 B2
(45) Date of Patent: Nov. 19, 2019

(54) POLYMER MOLDING COMPOSITION, WAVELENGTH CONVERTER, BACKLIGHT UNIT, AND LIQUID CRYSTAL DISPLAY DEVICE

(71) Applicant: FUJIFILM Corporation, Tokyo (JP)

(72) Inventor: Naoyoshi Yamada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 248 days.

(21) Appl. No.: 15/817,875

(22) Filed: Nov. 20, 2017

(65) Prior Publication Data

US 2018/0072942 A1 Mar. 15, 2018

Related U.S. Application Data

(63) Continuation of application No. PCT/JP2016/002548, filed on May 26, 2016.

(30) Foreign Application Priority Data

May 29, 2015 (JP) ................. 2015-110577

(51) Int. Cl.
| | |
|---|---|
| C09K 11/02 | (2006.01) |
| C09D 5/22 | (2006.01) |
| C09D 5/24 | (2006.01) |
| C09D 133/10 | (2006.01) |
| C09D 163/00 | (2006.01) |
| C09K 11/88 | (2006.01) |
| F21V 8/00 | (2006.01) |
| G02F 1/1335 | (2006.01) |
| C08K 3/30 | (2006.01) |
| C08K 9/04 | (2006.01) |

(52) U.S. Cl.
CPC ........... *C09K 11/02* (2013.01); *C09D 5/22* (2013.01); *C09D 5/24* (2013.01); *C09D 133/10* (2013.01); *C09D 163/00* (2013.01); *C09K 11/883* (2013.01); *G02B 6/005* (2013.01); *G02F 1/133621* (2013.01); *C08K 3/30* (2013.01); *C08K 9/04* (2013.01); *C08K 2003/3027* (2013.01); *C08K 2003/3036* (2013.01); *C08K 2201/001* (2013.01); *C08K 2201/011* (2013.01); *C08K 2201/012* (2013.01); *G02B 6/0055* (2013.01); *G02F 2001/133614* (2013.01); *G02F 2202/36* (2013.01)

(58) Field of Classification Search
CPC ........ C09K 11/02; C09K 11/883; C09D 5/22; C09D 133/10; C09D 163/00; G02B 6/005; G02B 6/0055; G02F 1/133621; C08K 3/30; C08K 9/04
USPC ..................................................... 252/301.36
See application file for complete search history.

(56) References Cited

U.S. PATENT DOCUMENTS

| | | |
|---|---|---|
| 2003/0218180 A1 | 11/2003 | Fujiwara |
| 2005/0110034 A1 | 5/2005 | Fujiwara |
| 2012/0113672 A1 | 5/2012 | Dubrow et al. |
| 2013/0313595 A1 | 11/2013 | Naasani et al. |

FOREIGN PATENT DOCUMENTS

| | | |
|---|---|---|
| JP | 2003-332620 A | 11/2003 |
| JP | 2003-332631 A | 11/2003 |
| JP | 2003-346665 A | 12/2007 |
| WO | 2011/031876 A1 | 3/2011 |
| WO | 2013/078252 A1 | 5/2013 |

OTHER PUBLICATIONS

International Search Report issued in PCT/JP2016/002548 dated Aug. 23, 2016.
Written Opinion issued in PCT/JP2016/002548 dated Aug. 23, 2016.
International Preliminary Report on Patentability completed by WIPO dated Dec. 5, 2017, in connection with International Patent Application No. PCT/JP2016/002548.

*Primary Examiner* — Edward M Johnson
(74) *Attorney, Agent, or Firm* — Edwards Neils LLC; Jean C. Edwards, Esq.

(57) ABSTRACT

A composition and a wavelength converter are provided. The composition includes at least: quantum dots having an emission peak wavelength in a visible light region; and quantum dots having an emission peak wavelength in an ultraviolet region or in a near-ultraviolet region. The wavelength converter includes, in a polymer: quantum dots having an emission peak wavelength in a visible light region; quantum dots having an emission peak wavelength in an ultraviolet region or in a near-ultraviolet region; and an oxide formed by oxidizing at least a part of the quantum dots having an emission peak wavelength in an ultraviolet region or in a near-ultraviolet region.

16 Claims, 3 Drawing Sheets

POLYMER MOLDING COMPOSITION PREPARATION STEP

COATING FILM FORMING STEP

UV CURING

POLYMER MOLDING COMPOSITION, WAVELENGTH CONVERTER, BACKLIGHT UNIT, AND LIQUID CRYSTAL DISPLAY DEVICE

CROSS-REFERENCE TO RELATED APPLICATIONS

This application is a continuation application of International Application No. PCT/JP2016/002548, filed May 26, 2016, which was published under PCT Article 21(2) in Japanese, the disclosure of which is incorporated herein by reference in its entirety. Further, this application claims priority from Japanese Patent Application No. 2015-110577, filed May 29, 2015, the disclosure of which is incorporated herein by reference in its entirety.

BACKGROUND OF THE INVENTION

1. Field of the Invention

The present invention relates to a composition and a polymer molding composition used for forming a fluorescent molded product such as a wavelength conversion layer which emits fluorescence by irradiation with excitation light, and a wavelength converter obtained using the same. The present invention also relates to a wavelength conversion member having a wavelength conversion layer, a backlight unit including the same, and a liquid crystal display device.

2. Description of the Related Art

A flat panel display such as a liquid crystal display device (LCD) has been more widely used as a space-saving image display device having low power consumption. A liquid crystal display device includes at least a backlight and a liquid crystal cell and typically further includes a member such as a backlight-side polarizing plate or a visible-side polarizing plate.

Recently, a configuration in which a wavelength conversion layer including quantum dots (QDs) as a light emitting material is provided in a wavelength conversion member of a backlight unit in order to improve color reproducibility of an LCD has attracted attention (refer to US2012/0113672A). The wavelength conversion member converts the wavelength of light incident from a light source so as to emit white light. In the wavelength conversion layer including the quantum dots as a light emitting material, white light can be realized using fluorescence which is emitted by excitation of two or three kinds of quantum dots having different light emitting properties caused by light incident from a light source.

The fluorescence emitted from the quantum dots has high brightness and has a small half-value width. Therefore, an LCD using quantum dots has excellent color reproducibility. Due to the progress of such a three-wavelength light source technique using quantum dots, the color reproduction range of an LCD has been widened from 72% to 100% in terms of National Television System Committee (NTSC) ratio.

It is known that permeation of oxygen is necessarily suppressed in a layer including quantum dots (hereinafter, referred to as "QD layer"). In a case where oxygen permeates into a QD layer, there is a problem in that the emission intensity decreases due to photooxidation caused by contact between quantum dots and oxygen.

In order to solve the problem, a configuration of a wavelength conversion member is disclosed in which a barrier film which suppresses permeation of oxygen is provided outside of a QD layer in order to protect the quantum dots from oxygen permeated from the outside of the wavelength conversion member (for example, US2012/0113672A).

Typically, for example, the following configurations of a barrier film are known: a configuration in which substrates having oxygen barrier properties are used as supports between which a QD layer is interposed such that the substrates themselves are used as barrier films; and a configuration in which an inorganic barrier layer or an organic barrier layer having oxygen barrier properties is provided on a surface of a support. As the inorganic barrier layer having oxygen barrier properties, an inorganic layer formed of an inorganic oxide, an inorganic nitride, an inorganic oxynitride, a metal, or the like is preferably used.

However, the configuration of the wavelength conversion member in which a barrier film is provided outside of the QD layer as described in US2012/0113672A can suppress the permeation of oxygen into the QD layer to some extent. For example, in a case where a wavelength conversion member having a long film shape is formed and then cut to manufacture a wavelength conversion member having a desired size, a QD layer is exposed to external air from a cut side surface. Therefore, a countermeasure against permeation of oxygen from the cut side surface is also required.

WO2011/031876A and WO2013/078252A disclose a configuration in which a QD layer includes a light stabilizer. WO2011/031876A and WO2013/078252A describe that, since the light stabilizer is present in the layer, effects of oxygen permeated into a barrier film, effects of oxygen permeated from a side surface, and the like can be reduced. In addition, US2013/0313595 discloses a quantum dot-containing bead containing a reducing agent such as ascorbic acid, palmitic acid, or alpha tocopherol (vitamin E).

SUMMARY OF THE INVENTION

On the other hand, in view of the above circumstances, in order to suppress oxygen mixing and QD oxidation in a manufacturing step, steps from the preparation of a quantum dot-containing polymerizable composition used for forming a QD layer to a QD layer forming step and a curing step are performed in a low oxygen concentration space purged with nitrogen. Although oxygen mixing into the QD layer in the manufacturing step can be suppressed by the above method, it is necessary that the entire forming (film forming) device and curing device are cased and are purged with nitrogen. Therefore, a large manufacturing device is required. From the viewpoint of improvement in productivity, it is preferable that a QD layer in which a decrease in emission intensity caused by photooxidation of quantum dots is small can be manufactured by a forming step and a curing step in a space with an oxygen concentration close to a normal oxygen concentration as much as possible. The above problem also arises not only in a wavelength converter including layered QDs but also in a wavelength converter including spherical or block QDs.

The present invention has been made in consideration of the above-described circumstances, and an object thereof is to provide a composition and a polymer molding composition in which a decrease in emission intensity caused by dissolved oxygen mixed in a manufacturing step is small and with which a quantum dot-containing wavelength converter can be manufactured.

Another object of the present invention is to provide a wavelength converter in which a decrease in emission intensity caused by photooxidation of quantum dots is small, a wavelength conversion member including the same, a backlight unit and a liquid crystal display device in which the emission intensity is not likely to decrease, the durability is high, and the brightness is high.

According to the present invention, there is provided a composition comprising at least: quantum dots having an emission peak wavelength in a visible light region; and quantum dots having an emission peak wavelength in an ultraviolet region or in a near-ultraviolet region.

In the composition of the present invention, it is preferable that the quantum dots having an emission peak wavelength in an ultraviolet region or in a near-ultraviolet region are quantum dots having an emission peak wavelength in a wavelength range of less than 430 nm. Further, it is preferable that the quantum dots having an emission peak wavelength in a visible light region is at least one kind of quantum dots selected from quantum dots having an emission peak wavelength in a wavelength range of 600 nm to 680 nm, quantum dots having an emission peak wavelength in a wavelength range of 520 nm to 560 nm, or quantum dots having an emission peak wavelength in a wavelength range of 430 nm to 480 nm.

In the specification, the term "an ultraviolet region or a near-ultraviolet region" refer to a wavelength range of about 200 nm to 430 nm, and the term "visible light region" refers to a wavelength range of about 430 nm to 780 nm.

According to the present invention, there is provided a polymer molding composition comprising: the composition according to the present invention; and a polymer molded product raw material.

As a preferable aspect of the polymer molding composition of the present invention, an aspect in which the polymer molded product raw material includes a polymerizable binder precursor, an aspect in which the polymer molded product raw material includes a binder, and an aspect in which the polymer molded product raw material includes a volatile solvent may be adopted. In addition, it is preferable that the polymer molded product raw material is cured by exposure to light having a wavelength in an ultraviolet region or in a near-ultraviolet region.

In the specification, the term "binder precursor" is a general term for compounds that can form a binder through chain polymerization, polycondensation, and the like. In particular, in a case of using chain polymerization, the binder precursor means compounds generally referred to as polymerizable monomers.

In addition, the term "binder" is a polymer compound and means a compound that can form a molding by dispersing and supporting quantum dots.

Further, in the specification, the term "volatile solvent" means a solvent having a vapor pressure of 1.0 hPa or higher at 20° C.

According to the present invention, there is provided a first wavelength converter that is formed by curing the polymer molding composition according to the present invention.

According to the present invention, there is provided a second wavelength converter comprising, in a polymer: quantum dots having an emission peak wavelength in a visible light region; quantum dots having an emission peak wavelength in an ultraviolet region or in a near-ultraviolet region; and oxides formed by oxidizing at least some of the quantum dots having an emission peak wavelength in an ultraviolet region or in a near-ultraviolet region.

According to the present invention, there is provided a wavelength conversion member comprising: a wavelength conversion layer including the first or second wavelength converter.

In the wavelength conversion member according to the present invention, it is preferable that a barrier film having an oxygen permeability of 1.00 $cm^3/(m^2 \cdot day \cdot atm)$ or lower is provided to be adjacent to at least one main surface of the wavelength conversion layer, and it is more preferable that the barrier film is provided to be adjacent to two main surfaces of the wavelength conversion layer.

In the specification, the oxygen permeability is a value measured using an oxygen permeability measuring device (OX-TRAN 2/20 (trade name), manufactured by Mocon Inc.) under conditions of measurement temperature: 23° C. and relative humidity: 90% RH. In the specification, for the unit of the oxygen permeability, $[cm^3/(m^2 \cdot day \cdot atm)]$ is used. The oxygen permeability of 1.0 $cm^3/(m^2 \cdot day \cdot atm)$ or lower corresponds to an oxygen permeability of $1.14 \times 10^{-1}$ fm/(s·Pa) in SI units.

According to the present invention, there is provided a backlight unit comprising: a light source; and the wavelength conversion member according to the present invention.

According to the present invention, there is provided a liquid crystal display device comprising: the backlight unit according to the present invention; and a liquid crystal cell.

The composition of the present invention includes at least quantum dots having an emission peak wavelength in a visible light region, and quantum dots having an emission peak wavelength in an ultraviolet region or in a near-ultraviolet region. The quantum dots are easily oxidized by irradiation with excitation light under the presence of oxygen and the emission intensity is decreased by oxidation of the quantum dots. Since the composition of the present invention includes the quantum dots having an emission peak wavelength in an ultraviolet region or in a near-ultraviolet region, in addition to the quantum dots having an emission peak wavelength in a visible light region, the oxidation degree of the quantum dots having an emission peak wavelength in a visible light region at the time of irradiation with excitation light is small. Therefore, according to the composition of the present invention, in a case where dissolved oxygen mixed into the composition is present in the manufacturing step, it is possible to manufacture a quantum dot-containing wavelength converter in which oxidation of the quantum dots having an emission peak wavelength in a visible light region caused by the dissolved oxygen is reduced and a decrease in emission intensity caused by the oxidation is small.

DESCRIPTION OF THE PREFERRED EMBODIMENTS

"Composition and Polymer Molding Composition"

Figure 1A:
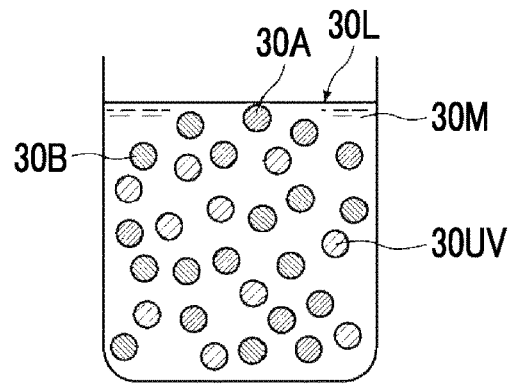
FIG. 1A is a schematic view showing a configuration of a polymer molding composition of the present invention.

Hereinafter, a composition of the present invention will be described in detail.

Quantum dots are fine particles of a compound semiconductor or an oxide semiconductor having a size of several n to several tens nm, have a unique emission peak wavelength according to the material and size, and are light emitters that are excited by absorption of light having an emission peak wavelength shorter than the emission peak wavelength. The quantum dots are easily oxidized and have properties in which particularly in a case of being excited by irradiation with excited light in an environment under the presence of oxygen, the quantum dots are very rapidly oxidized.

In application of a wavelength conversion member of a liquid crystal display device described in "SUMMARY OF THE INVENTION", since the quantum dots are necessarily a light emitting material which converts the wavelength of light incident from the light source to realize white light, quantum dots having an emission peak wavelength in a visible light region (hereinafter, also referred to as visible light quantum dots) has a wavelength conversion function. In the wavelength conversion layer, in a case where the visible light quantum dots are oxidized, the quantum dots lose the light emission function and thus it is necessarily to suppress deactivation of the visible light quantum dots as much as possible.

Since the quantum dots are used for application for emitting light having an emission peak wavelength longer than the excitation wavelength excited by excitation light as described above, in a case where oxygen is present in the layer in use, oxidation proceeds. In addition, in many cases, a polymer raw material of a wavelength conversion layer containing quantum dots in the polymer matrix is cured h using ultraviolet light, and in this case, oxidation proceeds in the curing step.

The present inventors have conceived that by using a composition containing quantum dots having an emission peak wavelength in an ultraviolet region or in a near-ultraviolet region (hereinafter, also referred to as ultraviolet light quantum dots) with visible light quantum dots to suppress the oxidation rate of the visible light quantum dots as much as possible by utilizing the easiness of oxidation of quantum dots at the time of irradiation with excitation light, oxygen is consumed by the ultraviolet light quantum dots at irradiation with ultraviolet light in a curing step of a polymer raw material and thus the oxidation rate of the visible light quantum dots is reduced. Since blue light having a shorter wavelength than ultraviolet light does not function as excitation light, the ultraviolet light quantum dots do not emit light in a case of using a wavelength conversion layer with blue light as excitation light and there is no adverse effect on the emission properties of the wavelength conversion layer.

In addition, in a case of using a wavelength conversion layer of ultraviolet light excitation, oxygen is consumed through oxidation by oxygen penetrated from the outside during using, the deactivation of the visible light quantum dots during using is suppressed and a decrease in emission intensity can be suppressed. Thus, it is possible to improve durability as a wavelength conversion layer. In this case, the emission peak wavelength is in an ultraviolet region or in a near-ultraviolet region and the emitted light is colorless. Thus, there is no adverse effect on the emission properties of the wavelength conversion layer.

That is, the composition of the present invention includes at least quantum dots having an emission peak wavelength in a visible light region, and quantum dots having an emission peak wavelength in an ultraviolet region or in a near-ultraviolet region.

In the composition of the present invention, the quantum dots having an emission peak wavelength in an ultraviolet region or in a near-ultraviolet region are preferably quantum dots having an emission peak wavelength in a wavelength range of less than 430 nm, are more preferably quantum dots having an emission peak wavelength in a wavelength range of 320 nm to 400 nm, and still more preferably quantum dots having an emission peak wavelength in a wavelength range of 340 nm to 380 nm. The half-value width of the emission spectrum of the quantum dots is generally about 20 nm. Therefore, it is preferable to select ultraviolet light quantum dots which do not adversely affect the emission properties of the visible light quantum dots at the time of using the wavelength conversion layer in consideration of the half-value width of the emission spectrum. In addition, it is preferable that the wavelength conversion layer is provided to be adjacent to a barrier film as described later. The emission peak wavelength of the ultraviolet light quantum dots is preferably in wavelength range in which the wavelength is not absorbed by the barrier film. In a case were the barrier film includes a polyethylene terephthalate (PET) film as a support, the emission peak wavelength is preferably 320 nm or more.

In addition, it is preferable that the quantum dots having an emission peak wavelength in a visible light region are at least one kind selected from quantum dots having an emission peak wavelength in a wavelength range of 600 nm to 680 nm (red quantum dots), quantum dots having an emission peak wavelength in a wavelength range of 520 nm to 560 nm (green quantum dots), or quantum dots having an emission peak wavelength in a wavelength range of 430 nm to 480 nm (blue quantum dots).

FIG. 1A is a schematic view showing a suitable configuration of a composition of the present invention. Since blue light LEDs are currently mainly used as excitation light, as shown in the drawing, a composition 30L of the present invention preferably includes visible light quantum dots including a red quantum dots 30A and green quantum dots 30B, and ultraviolet light quantum dots 30UV. In a case where blue light is incident on the wavelength conversion layer including the red quantum dots 30A and the green quantum dots 30B as excitation light, white light can be realized by red light emitted by the red quantum dots 30A, green light emitted by the green quantum dots 30B, and blue light transmitted through the wavelength conversion layer.

In the configuration further including blue quantum dots as visible light quantum dots, by allowing ultraviolet light, as excitation light, to be incident on the wavelength conversion layer, white light can be realized by red light emitted by the red quantum dots 30A, green light emitted by the green quantum dots 30B, and blue light emitted by the blue quantum dots.

In addition to the description, regarding the visible light quantum dots, for example, paragraphs 0060 to 0066 of JP2012-169271A can be referred to and regarding the ultraviolet light quantum dots, for example, JP2009-193991A and JP2009-173882A can be referred to. However, there is not limitation thereto. As the quantum dots, commercially available products can be used without any limitation. The emission wavelength of the quantum dots can be normally adjusted according to the composition of the particles, the size of the particles, or the composition and the size.

As the quantum dots, for example, core-shell type semiconductor nanoparticles are preferable from the viewpoint of improving durability. For the core, II-VI group semiconductor nanoparticles, III-V group semiconductor nanoparticles, and multicomponent semiconductor nanoparticles, and the like can be used. Specific examples thereof include CdSe, CdTe, CdS, ZnS, ZnSe, ZnTe, InP, InAs, and InGaP. However, there is not limitation thereto. Among these, CdSe, CdTe, InP, and InGaP are preferable from the viewpoint of emitting visible light with high efficiency. For the shell, CdS, ZnS, ZnO, GaAs, and a composite thereof can be used. However, there is not limitation thereto. The emission wavelength of the quantum dots can be normally adjusted according to the composition and size of the particles.

The quantum dots may be spherical particles or may be rod-like particles which are also called quantum rods. Further, the quantum dots may be tetrapod type particles. The emission half-value width (FWHM) is narrow and the from the viewpoint of expanding color reproduction range of a liquid crystal display device, spherical quantum dots or rod-quantum dots (that is, quantum rods) are preferable.

In the composition of the present invention, it is preferable that the visible light quantum dots and the ultraviolet light quantum dots are dispersed in the composition. IN the preparation of the composition of the present invention, the quantum dots may be added to the composition in a state of particles or may be added to the composition in a state of a dispersion liquid obtained by dispersing the quantum dots in a solvent. It is preferable to add the quantum dots in a state of a dispersion liquid from the viewpoint of suppressing aggregation of the quantum dots. The solvent used therein is not particularly limited. The amount of the quantum dots that can be added is, for example, 0.01 to 10 parts by mass with respect to the total 100 parts by mass of the composition of the present invention.

In the composition of the present invention, a ratio between the content of the visible light quantum dots and the content of the ultraviolet light quantum dots is not particularly limited but is preferably high in a range of not causing an adverse effect on emission properties at the time of using the wavelength conversion function. In addition, in a case of using irradiation with ultraviolet light for curing a wavelength converter, ratio between the content of the visible light quantum dots and the content of the ultraviolet light quantum dots is preferably high in a range of not inhibit curing by absorbing the ultraviolet light. From the above viewpoints, it is preferable that the ratio between the content of the visible light quantum dots and the content of the ultraviolet light quantum dots is in a range of 1:9 to 9:1.

In the embodiment in which the composition of the present invention is formed into a polymer molding composition further including a polymer molded product raw material according to the present invention, the composition can be used as a coating solution for forming a coating film of a wavelength conversion layer formed by dispersing the quantum dots in the polymer matrix. The coating film formation of the wavelength conversion layer is performed by first applying the polymer molding composition to a substrate to form a precursor film of the wavelength conversion layer, and then curing the precursor film.

In a case of using ultraviolet light in the curing step of the precursor film, the precursor film is cured by irradiation with the ultraviolet light and oxidation of the quantum dots is caused by dissolved oxygen in the precursor film. Since the ultraviolet light quantum dots and the visible light quantum dots are contained in the precursor film formed b using the polymer molding composition of the present invention, a part of dissolved oxygen is consumed by the ultraviolet light quantum dots and the oxidation rate of the visible light quantum dots is reduced. Further, the amount of oxygen in the cured film can be reduced. Therefore, according to the polymer molding composition of the present invention, the deactivation rate of the visible light quantum dots in the precursor film is suppressed and further a decrease in the emission intensity of the cured film (wavelength conversion layer) can be suppressed.

The consumption rate of the dissolved oxygen by the ultraviolet light quantum dots depends on the content ratio between the visible light quantum dots and the ultraviolet light quantum dots and easiness of oxidation of the material constituting the quantum dots. It is preferable that the ultraviolet light quantum dots are easily oxidized as much as possible. In addition, the content ratio of the ultraviolet light quantum dots with respect to the visible light quantum dots is preferably high in a range of not causing an adverse effect on the emission properties at the time of using the wavelength conversion function and the physical properties of the wavelength converter.

In the polymer molding composition of the present invention the polymer molded product raw material is not particularly limited and an embodiment including a polymerizable binder precursor (first embodiment), an embodiment including a binder (second embodiment), and an embodiment including a polymerizable binder precursor and a binder (third embodiment) may be used.

The first embodiment may further include a volatile solvent. In addition, the second embodiment preferably further includes a volatile solvent and it is more preferable that the binder is dissolved or swollen in a volatile solvent.

In addition, the polymer molded product raw material is preferably cured by irradiation with light having a wavelength in a near-ultraviolet region to an ultraviolet region and light or an electron beam having a wavelength shorter than a wavelength in an ultraviolet region (hereinafter, referred to as irradiation with an energy ray having a wavelength equal to or shorter than near-ultraviolet light), and is more preferably cured by irradiation with light having a wavelength in a near-ultraviolet region to an ultraviolet region from the viewpoint of obtaining the effect of consuming oxygen by the ultraviolet light quantum dots in the curing step. The curing by irradiation with an energy ray having a wavelength equal to or shorter than near-ultraviolet light includes curing by polymerization of a polymerizable binder precursor, curing by volatilization through exposure of a volatile solvent, and a combination thereof.

The polymer molded product raw material may be cured by thermal curing. In this case, in the curing step, the effect of consuming oxygen by the ultraviolet light quantum dots is not obtained but the effect of consuming oxygen by the ultraviolet light quantum dots by irradiation with excitation light at the time of using the wavelength conversion function can be obtained. As described above, the same effect of consuming oxygen by the ultraviolet light quantum dots by irradiation with excitation light at the time of using the wavelength conversion function can be obtained in the curing by irradiation with an energy ray having a wavelength equal to or shorter than near-ultraviolet light.

[Embodiment Including Polymerizable Binder Precursor (First Embodiment)]

<Binder Precursor>

As described above, the binder precursor is a general term for compounds that can form a binder through chain polymerization, polycondensation, and the like. In particular, in a case of using chain polymerization, the binder precursor means that compounds generally referred to as polymerizable compounds (monomers) are binder precursors. Examples of the binder precursor that can form a binder through chain polymerization include a radical polymerizable compound and a cationic polymerizable compound.

(Polymerizable Compound)

The polymerizable compound included in the polymer molding composition is not particularly limited and is preferably a radically polymerizable compound. From the viewpoints of transparency, adhesiveness, and the like of the cured coating film, it is preferable that the radically polymerizable compound is a monofunctional or polyfunctional (meth)acrylate monomer. If polymerizable, the radically polymerizable compound may be a prepolymer or a polymer of the monofunctional or polyfunctional (meth)acrylate monomer. In this specification, "(meth)acrylate" represents at least either or both of acrylate and methacrylate. The same shall be applied to "(meth)acryloyl".

As the monofunctional (meth)acrylate monomer, for example, acrylic acid, methacrylic acid, or a derivative thereof can be used. More specifically, a monomer having one polymerizable unsaturated bond ((meth)acryloyl group) of (meth)acrylic acid in the molecule can be used.

Specific examples include: an alkyl (meth)acrylate with an alkyl group having 1 to 30 carbon atoms such as methyl (meth)acrylate, n-butyl (meth)acrylate, isobutyl (meth)acrylate, 2-ethylhexyl (meth)acrylate, isononyl (meth)acrylate, n-octyl (meth)acrylate, lauryl (meth)acrylate, or stearyl (meth)acrylate; an aralkyl (meth)acrylate with an alkyl group having 7 to 20 carbon atoms such as benzyl (meth) acrylate; an alkoxyalkyl (meth)acrylate with an alkoxyalkyl group having 2 to 30 carbon atoms such as butoxyethyl (meth)acrylate; an aminoalkyl (meth)acrylate with a (monoalkyl or dialkyl)aminoalkyl group having 1 to 20 carbon atoms in total such as N,N-dimethylaminoethyl (meth)acrylate; a polyalkylene glycol alkyl ether (meth)acrylate with an alkylene chain having 1 to 10 carbon atoms and a terminal alkyl ether having 1 to 10 carbon atoms such as diethylene glycol ethyl ether (meth)acrylate, triethylene glycol butyl ether (meth)acrylate, tetraethylene glycol monomethyl ether (meth)acrylate, hexaethylene glycol monomethyl ether (meth)acrylate, octaethylene glycol monomethyl ether (meth)acrylate, nonaethylene glycol monomethyl ether (meth)acrylate, dipropylene glycol monomethyl ether (meth)acrylate, heptapropylene glycol monomethyl ether (meth)acrylate, or tetraethylene glycol monoethyl ether (meth)acrylate a polyalkylene glycol aryl ether (meth)acrylate with an alkylene chain having 1 to 30 carbon atoms and a terminal aryl ether having 6 to 20 carbon atoms such as hexaethylene glycol phenyl ether (meth)acrylate; a (meth) acrylate having an alicyclic structure and having 4 to 30 carbon atoms in total such as cyclohexyl (meth)acrylate, dicyclopentanyl (meth)acrylate, isobomyl (meth)acrylate, or a methylene oxide adduct of cyclodecatriene (meth)acrylate; a fluorinated alkyl(meth)acrylate having 4 to 30 carbon atoms in total such as heptadecafluorodecyl (meth)acrylate; a (meth)acrylate having a hydroxyl group such as 2-hydroxyethyl (meth)acrylate, 3-hydroxypropyl (meth)acrylate, 4-hydroxybutyl (meth)acrylate, triethylene glycol mono (meth)acrylate, tetraethylene glycol mono(meth)acrylate, hexaethylene glycol mono(meth)acrylate, octapropylene glycol mono(meth)acrylate, or glycerol mono(meth)acrylate or di(meth)acrylate; a (meth)acrylate having a glycidyl group such as glycidyl (meth)acrylate; a polyethylene glycol mono(meth)acrylate with an alkylene chain having 1 to 30 carbon atoms such as tetraethylene glycol mono(meth)acrylate, hexaethylene glycol mono(meth)acrylate, or octapropylene glycol mono(meth)acrylate; and a (meth)acrylamide such as meth)acrylamide, N,N-dimethyl (meth)acrylamide, N-isopropyl (meth)acrylamide, 2-hydroxyethyl (meth)acrylamide, or acryloylmorpholine. The monofunctional (meth) acrylate monomer is not limited to this examples.

As the monofunctional (meth)acrylate monomer, an alkyl (meth)acrylate having 4 to 30 carbon atoms is preferable, and an alkyl (meth)acrylate having 12 to 22 carbon atoms is more preferable from the viewpoint of dispersibility of quantum dots. As the dispersibility of the quantum dots is improved, the amount of light directed from the wavelength conversion layer to an exit surface increases, which is efficient for improving front brightness and front contrast. Specifically, as the monofunctional (meth)acrylate monomer, for example, butyl (meth)acrylate, octyl (meth)acrylate, lauryl (meth)acrylate, oleyl (meth)acrylate, stearyl (meth) acrylate, behenyl (meth)acrylate, butyl (meth)acrylamide, octyl (meth)acryl amide, lauryl (meth)acrylamide, oleyl (meth)acrylamide, stearyl (meth)acrylamide, or behenyl (meth)acrylamide is preferable. Among these, lauryl (meth) acrylate, oleyl (meth)acrylate, or stearyl (meth)acrylate is more preferable.

Hereinafter, the structural formula of lauryl methacrylate used in Examples described later will be shown.

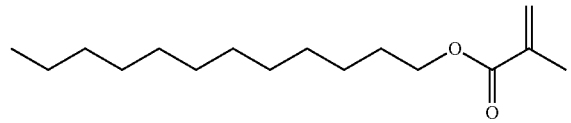

LAURYL METHACRYLATE (LMA)

A monomer having one polymerizable unsaturated bond ((meth)acryloyl group) of the (meth)acrylic acid in the molecule and a polyfunctional (meth)acrylate monomer having two or more (meth)acryloyl groups in the molecule can also be used in combination.

Preferable examples of a bifunctional (meth)acrylate monomer among the bifunctional or higher (meth)acrylate monomers include neopentyl glycol di(meth)acrylate, 1,9-nonanediol di(meth)acrylate, tripropylene glycol di(meth) acrylate, ethylene glycol di(meth)acrylate, tetraethylene glycol di(meth)acrylate, hydroxypivalic acid neopentyl glycol di(meth)acrylate, polyethylene glycol di(meth)acrylate, dicyclopentenyl (meth)acrylate, dicyclopentenyloxyethyl (meth)acrylate, and dicyclopentanyl di(meth)acrylate.

In addition, preferable examples of a trifunctional (meth) acrylate monomer among the bifunctional or higher (meth) acrylate monomers include epichlorohydrin (ECH)-modified glycerol tri(meth)acrylate; ethylene oxide (EO)-modified glycerol tri(meth)acrylate, propylene oxide (PO)-modified glycerol tri(meth)acrylate, pentaerythritol triacrylate, pentaerythritol tetraacrylate, EO-modified phosphoric acid triacrylate, trimethylolpropane tri(meth)acrylate, caprolactone-modified trimethylolpropane tri(meth)acrylate, EO-modified trimethylolpropane tri(meth)acrylate, POmodified trimethylolpropane tri(meth)acrylate, tris(acryloxyethyl)isocyanurate, dipentaerythritol hexa(meth)acrylate, dipentaerythritol penta(meth)acrylate, caprolactone-modified dipentaerythritol hexa(meth)acrylate, dipentaerythritol hydroxy enta(meth)acrylate, alkyl-modified dipentaerythritol penta(meth)acrylate, dipentaerythtitol poly(meth)acrylate, alkyl-modified dipentaerythritol tri(meth)acrylate, ditrimethylolpropane tetra(meth)acrylate, pentaerythritol ethoxy tetra(meth)acrylate, and pentaerythritol tetra(meth)acrylate.

It is preferable that the polymer molding composition includes, as the radically polymerizable compound, a (meth)acrylate monomer in which a ratio Mw/F of the molecular weight Mw of the radically polymerizable compound to the number F of (meth)acryloyl groups per molecule is 200 or lower. Mw/F is preferably 150 or lower and more preferably 100 or lower. By using a (meth)acrylate monomer in which Mw/F is low, the oxygen permeability of the wavelength conversion layer which is formed by curing the polymer molding composition can be reduced, and thus the light resistance of the wavelength conversion member can be improved. In addition, by using a (meth)acrylate monomer in which Mw/F is low, the crosslinking density of the polymer in the wavelength conversion layer can be increased, and the fracture of the wavelength conversion layer can be prevented, which is preferable.

Specific examples of the (meth)acrylate monomer in which Mw/F is 200 or lower include pentaerythritol triacrylate, pentaerythritol tetraacrylate, trimethylolpropane trimethacrylate, dipentaerythritol hexaacrylate, and tricyclodecane dimethanol diacrylate.

The amount of the polyfunctional (meth)acrylate monomer used with respect to 100 parts by mass of the total amount of the polymerizable compound in the quantum polymer molding composition is preferably 5 parts by mass or more from the viewpoint of the strength of the coating film and is preferably 95 parts by mass or less from the viewpoint of suppressing the gelation of the composition.

In addition, the amount of the radically polymerizable compound used with respect to 100 parts by mass of the total amount of the polymer molding composition is preferably 10 to 99.9 parts by mass, more preferably 50 to 99.9 parts by mass, and particularly preferably 92 to 99 parts by mass.

In addition, as the polymerizable compound included in the polymer molding composition, an alicyclic epoxy compound is preferable. The amount of the alicyclic epoxy compound contained in the polymer molding composition is preferably 30 mass % or more, more preferably 50 mass % or more, and still more preferably 80 mass % or more from the viewpoint of oxygen barrier properties.

As the alicyclic epoxy compound, one kind may be used, or two or more kinds having different structures may be used. In the following description, in a case where two or more kinds having different structures are used as the alicyclic epoxy compound, the content of the alicyclic epoxy compound refers to the total content thereof. The same shall be applied to a case where two or more kinds having different structures are used as other components.

The alicyclic epoxy compound has higher curing properties by light irradiation than an aliphatic epoxy compound. It is preferable that a polymerizable compound having excellent photocuring properties is used from the viewpoints of improving productivity and forming a layer in which an irradiated portion and a non-irradiated portion have uniform properties. As a result, in the wavelength conversion member, the curling of the wavelength conversion layer can be suppressed, and the quality can be made to be uniform. In general, an epoxy compound is likely to have a reduced curing shrinkage during photocuring. This point is advantageous in forming a smooth wavelength conversion layer having a reduced deformation.

The alicyclic epoxy compound includes at least one alicyclic epoxy group. Here, the alicyclic epoxy group refers to a monovalent substituent having a condensed ring of an epoxy ring and a saturated hydrocarbon ring and preferably a monovalent substituent having a condensed ring of an epoxy ring and a cycloalkane ring. Preferable examples of the alicyclic epoxy compound include a compound having one or more structures shown below in one molecule, in which an epoxy ring and a cyclohexane ring are condensed. The number of the structures included in one molecule may be two or more and is preferably one or two.

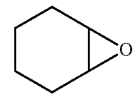

In addition, the structure may include one or more substituents. Examples of the substituent include an alkyl group (for example, an alkyl group having 1 to 6 carbon atoms), a hydroxyl group, an alkoxy group (for example, an alkoxy group having 1 to 6 carbon atoms), and a halogen atom (for example, a fluorine atom, a chlorine atom, or a bromine atom), a cyano group, an amino group, a nitro group, an acyl group, and a carboxyl group. The structure may have the above-described substituent but is preferably unsubstituted.

In addition, the alicyclic epoxy compound may include a polymerizable functional group other than the alicyclic epoxy group. The polymerizable functional group refers to a functional group which can cause a polymerization reaction to occur by radical polymerization or cationic polymerization, and examples thereof include a (meth)acryloyl group.

Preferable examples of a commercially available product of the alicyclic epoxy compound include: CELLOXIDE (registered trade name) 2000, CELLOXIDE 2021P, CELLOXIDE 3000, CELLOXIDE 8000, CYCLOMER (registered trade name) M100, EPOLEAD GT 301, and EPOLEAD GT 401 (all of which are manufactured by Daicel Corporation); 4-vinylcyclohexene dioxide (manufactured by Sigma-Aldrich Co., LLC.); D-limonene oxide (manufactured by Nippon Terpene Chemicals, Inc.); and SANSOCIZER (registered trade name) E-PS (manufactured by New Japan Chemical Co., Ltd.). Among these, one kind can be used alone, or two or more kinds can be used in combination.

From the viewpoint of improving adhesiveness between the wavelength conversion layer and a layer adjacent thereto, the following alicyclic epoxy compound I or II is more preferable. As a commercially available product of the alicyclic epoxy compound I, CELLOXIDE 2021P (manufactured by Daicel Corporation) can be used. As a commercially available product of the alicyclic epoxy compound II, CYCLOMER M100 (manufactured by Daicel Corporation) can be used.

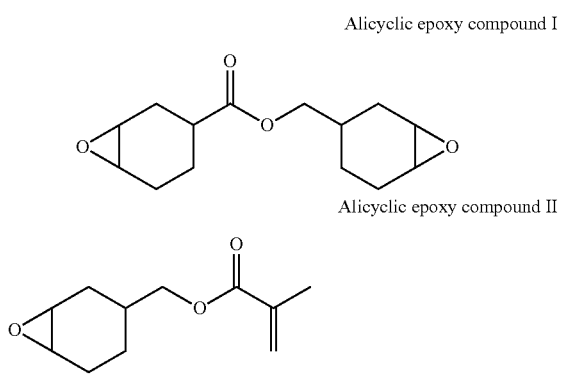

Alicyclic epoxy compound I

Alicyclic epoxy compound II

In addition, the alicyclic epoxy compound can also be synthesized using a well-known method. A method of preparing the alicyclic epoxy compound is not particularly limited. For example, the alicyclic epoxy compound can be synthesized with reference to "The Fourth Series of Experimental Chemistry, 20 Organic Synthesis II, pp. 213—(Maruzen-Yushodo Co., Ltd., 1992), "The chemistry of heterocyclic compounds—Small Ring Heterocycles, part 3 Oxiranes" (Ed, by Alfred Hasfner, John Wiley and Sons, An Interscience Publication, New York, 1985), "Adhesion, Vol. 29, No. 12, 32" (Yoshimura, 1985), "Adhesion, Vol. 30, No. 5, 42" (Yoshimura, 1986), "Adhesion, Vol. 30, No. 7, 42" (Yoshimura, 1986), JP1999-100378A (JP-H11-100378A), and JP2926262B.

In a case where the alicyclic epoxy compound is used as a polymerizable compound, one or more other polymerizable compounds may be included in the compound. As the other polymerizable compounds, a (meth)acrylate compound such as a monofunctional (meth)acrylate compound or a polyfunctional (meth)acrylate compound, an oxirane compound, or an oxetane compound is preferable. In the present invention and this specification, a (meth)acrylate compound or (meth)acrylate represents a compound having one or more (meth)acryloyl groups in one molecule, and a (meth)acryloyl group represents either or both of art acryloyl group and a methacryloyl group.

The oxirane compound is also called ethylene oxide, and representative examples thereof include a functional group called a glycidyl group. In addition, the oxetane compound is a 4-membered cyclic ether. By using this polymerizable compound, for example, the (meth)acrylate compound in combination with the alicyclic epoxy compound, the (meth) acrylate compound and a polymer of the alicyclic epoxy compound forms an interpenetrating polymer network (IPN), and a polymer can be designed so as to exhibit desired mechanical properties and optical properties. In addition, the oxirane compound or the oxetane compound is copolymerizable with the alicyclic epoxy compound, and a polymer can be designed so as to exhibit desired mechanical properties and optical properties. In addition, by using these compounds in combination, the viscosity of the composition before curing, the dispersibility of the quantum dots, and the solubility of a photopolymerization initiator described below and other additives can also be adjusted.

In addition, the content of the curable compound including an alicyclic epoxy compound is preferably 10 to 99.9 mass %, more preferably 50 to 99.9 mass %, and still more preferably 92 to 99 mass % with respect to 100 mass % of the total amount of the polymer molding composition.

(Polymerization Initiator)

Optionally, the polymer molding composition may include a polymerization initiator. As the polymerization initiator, a polymerization initiator which is preferable depending on the kind of the polymerizable compound in the polymer molding composition is preferably used. In a case where the polymerizable compound is radically polymerizable, the quantum dot-containing polymerizable composition may include a well-known radical initiator. The details of the polymerization initiator can be found in paragraph "0037" of JP2013-043382A. The content of the polymerization initiator is preferably 0.1 mol % or higher and more preferably 0.5 mol % to 2 mol % with respect to the total mass of the polymerizable compound included in the polymer molding composition.

(Silane Coupling Agent)

The polymer molding composition can further include a silane coupling agent. Since the adhesiveness between the wavelength conversion layer formed of a polymerizable composition including a silane coupling agent and the adjacent layer becomes strong by the silane coupling agent, further excellent light resistance can be exhibited. This is mainly because the silane coupling agent included in the wavelength conversion layer forms a covalent bond with the surface of the adjacent layer and the constituent component of the layer through a hydrolysis reaction or a condensation reaction. In this case, an inorganic barrier layer, which will be described later, is preferably provided as the adjacent layer. In addition, in a case in which the silane coupling agent has a reactive functional group such as a radical polymerizable group or the like, the formation of a cross-linking structure with a monomer component constituting the wavelength conversion layer can also provide an improvement in adhesiveness between the wavelength conversion layer and the adjacent layer. In the specification, the silane coupling agent included in the wavelength conversion layer is used as the meaning including the form of the silane coupling agent the form after the above reactions.

For the silane coupling agent, a known silane coupling agent can be used without any limitation. A preferable silane coupling agent in terms of adhesiveness can include a silane coupling agent represented by Formula (1) described in JP2013-43382A. With respect to the details thereof, paragraphs 0011 to 0016 of JP2013-43382A can be referenced. The amount of an additive used such as a silage coupling agent is not particularly limited and can be appropriately set.

(Solvent)

Optionally, the polymer molding composition may include a solvent (volatile solvent). In this case, the kind and addition amount of the solvent used are not particularly limited. For example, as the solvent, one organic solvent or a mixture of two or more organic solvents may be used. As a preferable solvent, the same solvents described in a second embodiment described later may be used

[Embodiment Including Binder (Second Embodiment)]
<Binder>

In the second embodiment, as the binder, known solution-film-formable polymers can be used. Examples thereof include polyacrylates, polycarbonates, polyethylenes, polyketones, polyether ether ketones, polyesters, polyamides, polyimides, polyacrylamides, polycycloolefins, polyvinylidene fluoride (PVDF), polyvinyl chloride (PVC), ethylene-vinyl acetate copolymer resin (EVA), polyvinyl alcohols, polyvinyl butyrals, polyvinyl acetals, and cellulosic polymers (such as ethyl cellulose, isopropyl cellulose phthalate, nitrocellulose, and cellulose acylate) can be used.

Particularly, these solution-film-formable polymers are preferably binders formed by polymerization of the binder precursors described above. The polymer molding composition of the second embodiment may include a solution-film-formable polymer in a solution-film-formable state. However, an embodiment in which the solution-film-formable polymer is dissolved or swollen in a volatile solvent is preferable.

<Volatile Solvent>

The volatile solvent that may be included in the composition of the present invention has functions of a dispersion medium for stabilizing the dispersion state of the quantum dots (dispersion stabilization function), a solvent for dilution (concentration adjusting function), a solvent for dissolving and dispersing a binder or a binder precursor, and other functional additives for forming solutions and dispersion liquids (dissolution function), and the like.

At least some of the volatile solvent is volatilized and removed in the curing step of the wavelength conversion layer. At this time, in order to facilitate volatilization and removal, the boiling point of the volatile solvent is preferably low. As described above, the volatile solvent is a component having a vapor pressure of 1.0 hPa or higher at 20° C., preferably a component having a vapor pressure of 3 hPa to 600 hPa at 20° C., and more preferably a component having a vapor pressure of 10 hPa to 500 hPa. Regarding the boil point at normal pressure, the boiling point is preferably in a range of 30° C. to 180° C., more preferably in a range of 35° C. to 160° C., an still more preferably in a range of 38° C. to 150° C. According to the volatile solvent, while the removal of the solvent is being promoted, shape abnormality such as unevenness formation in the vicinity of the surface and rough bubbles of about several mm formed in the film due to excessively rapid volatilization of the solvent can be prevented.

In a case where an excessive amount of the volatile solvent remains, this volatile solvent may cause an internal defect in the sealing structure of a barrier film described later, and thus the amount of the volatile solvent remaining is set to less than 0.2 parts by mass with respect to 100 parts by mass of the obtained wavelength conversion layer. The amount of the volatile solvent remaining is preferably 0.1 parts by mass or less and more preferably 0.05 parts by mass. For the removal method, the volatile solvent may be removed by being volatilized by heating and drying as described later or may be removed by being changed into a non-volatile component through a chemical reaction.

A preferable volatile solvent is selected such that the above-described functions are suitably exhibited with respect to the above-described quantum dots, binders, binder precursors, and other functional additives shown below. Examples of the volatile solvent include dibutyl ether, dimethoxyethane, diethoxyethane, propylene oxide, 1,4-dioxane, 1,3-dioxolane, 1,3,5-trioxane, tetrahydrotitran, anisole, phenetole, dimethyl carbonate, methyl ethyl carbonate, diethyl carbonate, acetone, methyl ethyl ketone (MEK), diethyl ketone, dipropyl ketone, diisobutyl ketone, cyclopentanone, cyclohexanone, methyl cyclohexanone, ethyl formate, propyl formate, pentyl formate, methyl acetate, ethyl acetate, propyl acetate, methyl propionate, ethyl propionate, γ-butyrolactone, methyl 2-methoxyacetate, methyl 2-ethoxyacetate, ethyl 2-ethoxyacetate, ethyl 2-ethoxypropionate, 2-methoxyethanol, 2-propoxyethanol, 2-butoxyethanol, 1,2-diacetoxyacetone, acetylacetone, diacetone alcohol, methyl acetoacetate, ethyl acetoacetate, methyl alcohol, ethyl alcohol, isopropyl alcohol, n-butyl alcohol, cyclohexyl alcohol, isobutyl acetate, methyl isobutyl ketone (MIBK), 2-octanone, 2-pentanone, 2-hexanone, ethylene glycol ethyl ether, ethylene glycol isopropyl ether, ethylene glycol butyl ether, propylene glycol methyl ether, ethyl carbitol, butyl carbitol, hexane, heptane, octane, cyclohexane, methylcyclohexane, ethylcyclohexane, benzene, toluene, and xylene. These may be used alone or in combination of two or more thereof.

In addition, as the volatile solvent that can be made nonvolatile by a chemical reaction, among the above-described binder precursors, compounds having a particularly low molecular weight can be suitably used. Examples thereof include polymerizable compounds such as methyl (meth)acrylate, ethyl(meth)acrylate, butyl(meth)acrylate, glycidyl methacrylate, and cyclohexane oxide. These compounds are removed by causing a polymerization reaction and thus forming a polymer to obtain nonvolatility.

<Other Functional Additives>

Other functional additives can be added to the composition of the present invention as needed. Examples of such additives include a specific gravity regulator, a leveling agent, a defoaming agent, a surface energy adjusting agent, an antioxidant for preventing deterioration under light irradiation for a long period of time, a radical scavenger, a moisture getter agent, an oxygen getter agent, an UV absorbent for obtaining a desired fluorescence light emission spectrum, a visible light absorbent, an IR absorbent, a dispersion assistant for supporting dispersion of a fluorescent substance, a micelle agent, a plasticizer for controlling the dynamic properties and surface properties of the obtained molding, a brittleness improving agent, an adhesiveness improving agent, an antistatic agent, an antifouling agent, a filler, a refractive index adjusting agent for controlling the optical properties of a molding, and a light scattering agent.

As described above, the composition of the present invention includes at least the quantum dots having an emission peak wavelength in a visible region and the quantum dots having an emission peak wavelength in an ultraviolet region and in a near-ultraviolet region. Since the composition of the present invention also include the quantum dots having an emission peak wavelength in an ultraviolet region and in a near-ultraviolet region in addition to the quantum dots having an emission peak wavelength in a visible region, the oxidation degree of the quantum dots having an emission peak wavelength in a visible light region at the time of irradiation with excitation light is reduced. Thus, according to the composition of the present invention, even in a case where dissolved oxygen mixed into the composition in the manufacturing step is present, a quantum dot-containing wavelength converter in which oxidation of the quantum dots having an emission peak wavelength in a visible light region by the dissolved oxygen is reduced and a decrease in emission intensity caused by the oxidation is small can be manufactured.

[Wavelength Conversion Layer (Wavelength Converter) and Wavelength Conversion Member Including the Same]

As described above, the composition and the polymer molding composition of the present invention is suitable for manufacturing of a wavelength conversion layer (wavelength converter) 30 according to the following embodiment. With reference to the drawings, the wavelength conversion layer of the present invention and the manufacturing step thereof will be described. FIGS. 1A to 1D are schematic step views showing a manufacturing step of the wavelength conversion layer 30, and FIG. 2 is a cross-sectional view showing a schematic configuration of a wavelength conversion member according to an embodiment. In the drawings of the specification, a scale of each portion is appropriately changed and shown for facilitating visual observation.

A wavelength conversion member 1D shown in FIG. 2 includes quantum dots (30A, 30B) having an emission peak wavelength in a visible light region, quantum dots (30UV) having an emission peak wavelength in an ultraviolet region and in a near-ultraviolet region, a wavelength conversion layer (wavelength converter) 30 formed by curing a polymer molding composition 30L including a polymer molded product raw material, and barrier films 10 and 20 provided on both surfaces thereof. The barrier film 10 includes an unevenness imparting layer 13 which imparts an uneven structure to a surface of the barrier film opposite to the wavelength conversion layer 30 side. In the embodiment, the unevenness imparting layer (mat layer) 13 also functions as a light diffusion layer.

In the wavelength conversion member 1D, the wavelength conversion layer (wavelength converter) 30 is manufactured by curing the polymer molding composition of the present invention as described above. In the embodiment, the wavelength conversion layer 30 formed by forming a polymer molding composition 30L on a barrier film 10 having a barrier layer 12 formed by an organic barrier layer 12a and an inorganic barrier layer 12b on a surface of a support 11 (or a barrier film 20 including a barrier layer 22 formed by an organic barrier layer 22a and an inorganic barrier layer 22b on a surface of a substrate 21) by using the polymer molding composition of the present invention and then irradiating the polymer molding composition 30L with an energy ray having a wavelength equal to or shorter than a wavelength in a near-ultraviolet region to cure the composition. Accordingly, the wavelength conversion layer 30 includes the quantum dots (30A, 30B) having an emission peak wavelength in a visible light region and the quantum dots (30UV) having an emission peak wavelength in an ultraviolet region or in a near-ultraviolet region and further includes oxides 40A and 40B formed by oxidizing at least some of the visible light quantum dots and an oxide 40UV formed by oxidizing at least some of the ultraviolet light quantum dots in a polymer matrix 30P. In the embodiment, the oxides 40A and 40B formed by oxidizing at least some of the visible light quantum dots are included in the wavelength conversion layer. However, in a case where a trace amount of dissolved oxygen is present in the wavelength conversion layer, these oxides may not be included therein. In addition, in the drawing, the oxides 40A, 40B, and 40UV have a particle shape. However, the quantum dots at least some of which are oxidized may not have a particle shape.

FIGS. 1A to 2, the quantum dots 30A and 30B are enlarged to facilitate visual observation. However, actually, for example, the diameter of the quantum dot is about 2 to 10 nm with respect to a thickness of the wavelength conversion layer 30 of 50 to 100 μm. The quantum dots are as described in the section of the composition of the present invention.

The thickness of the wavelength conversion layer 30 is preferably in a range of 1 to 300 μm, more preferably in a range of 10 to 200 μm, and still more preferably in a range of 20 to 100 μm. In a case where the thickness thereof is 1 μm or more, a high wavelength conversion effect is obtained and thus this case is preferable. In addition, in a case where the thickness thereof is 300 μm or less, the thickness of a backlight unit can be reduced in a case where the wavelength conversion layer is incorporated into the backlight unit, and thus this case is preferable.

Since the wavelength conversion layer 30 is formed by curing the composition of the present invention, as shown in Examples described later, the emission intensity is not likely to decrease and the durability is excellent. An example of the manufacturing step of the wavelength conversion layer 30 will be described with reference to FIGS. 1A to 1D.

First, as shown in FIG. 1A, a polymer molding composition 30L including the visible light quantum dots 30A and 30B, and the ultraviolet light quantum dots 30UV in a polymer molded product raw material 30M is prepared. The preparation (solution preparation) can be performed by a typical method. A mixing method of raw materials is not particularly limited. Stirring and mixing using a mixing tank or the like may be used and mixing may be performed in a liquid supply line using a static mixer.

Figure 1B:
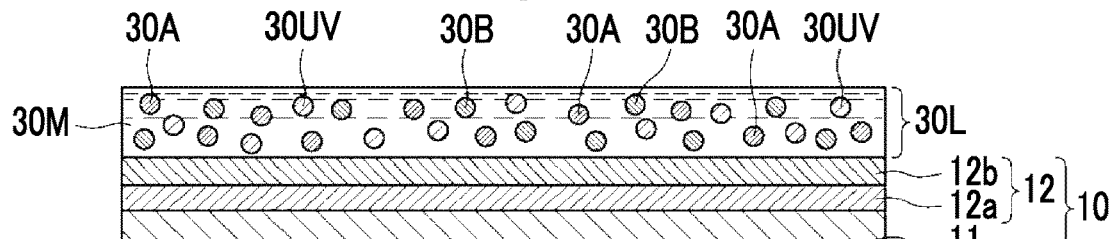
FIG. 1B is a schematic cross-sectional view showing a coating film forming step in a method of manufacturing a wavelength converter using a composition of the present invention.
Figure 1C:
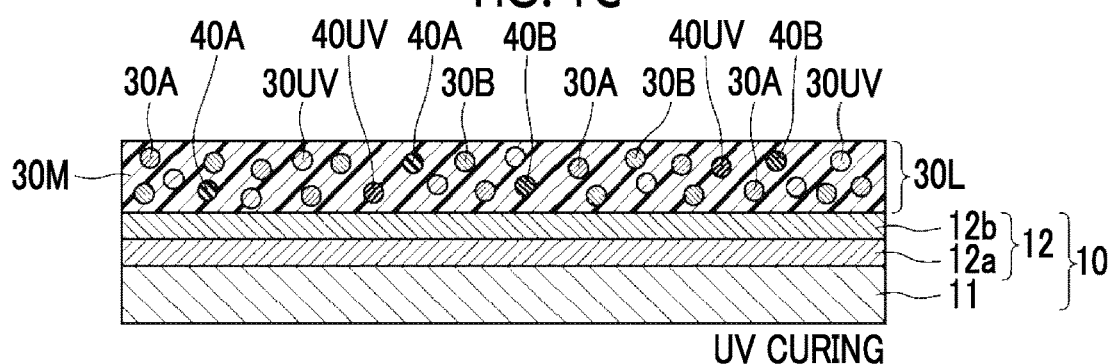
FIG. 1C is a schematic cross-sectional view showing an UV curing step in the method of manufacturing a wavelength converter using the composition of the present invention.
Figure 1D:
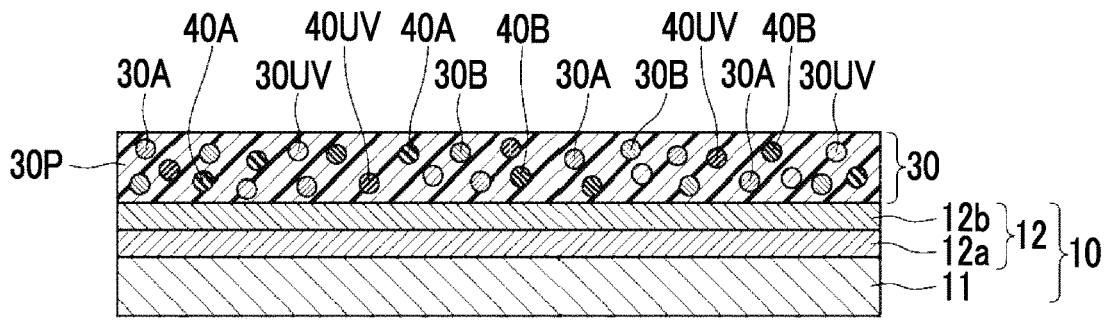
FIG. 1D is a schematic cross-sectional view showing a state after curing of the wavelength converter in the method of manufacturing a wavelength converter using the composition of the present invention.
Figure 2:
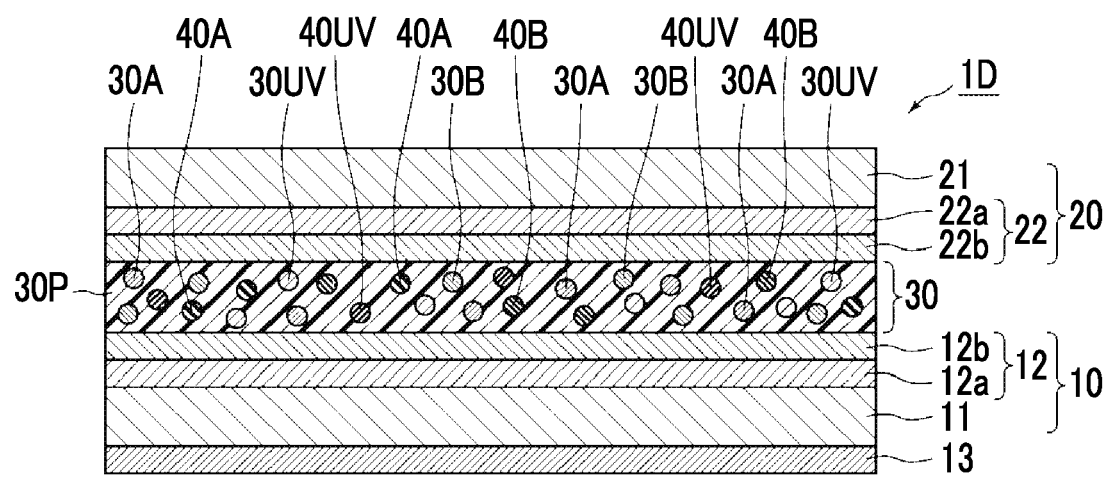
FIG. 2 is a cross-sectional view showing a schematic configuration of a wavelength conversion member according to an embodiment of the present invention.

Next, the prepared polymer molding composition 30L of the present invention is applied to the surface to form a precursor layer of the wavelength conversion layer (FIG. 1B). For the application of the polymer molding composition 30L, various known coating methods can be applied. Examples of the coating method include various coating methods such as a curtain coating method, a dip coating method, a spin coating method, a printing coating method, a spray coating method, a slot coating method, a roll coating method, a slide coating method, a blade coating method, a gravure coating method, and a wire bar method. The above coating method can be appropriately selected according to the properties of a composition to be used.

Next, the polymer molding composition 30L is cured. The polymer molded product raw material 30M may be cured by thermal curing as described above. However, in FIG. 1C, the polymer molded product raw material 30M of the polymer molding composition 30L is cured by irradiating the composition with an energy ray having a wavelength equal to or shorter than near-ultraviolet light. In the embodiment, since the polymer molded product raw material 30M of the polymer molding composition 30L is cured by irradiating the polymer molding composition 30L with an energy ray having a wavelength equal to or shorter than near-ultraviolet light, some of the visible light quantum dots 30A and 30B, and the ultraviolet light quantum dots 30UV are oxidized by irradiation with the energy ray to form oxides 40A, 40B, and 40UV respectively. The embodiment of each polymer molded product raw material by irradiation with the energy ray is as described above.

In a case where a large amount of volatile solvent remains in the wavelength conversion layer 30 even after the curing reaction, a removal step thereof may be provided. In the removal step, removal is performed by irradiation with the energy ray having a wavelength equal to or shorter than ultraviolet light and thus a high effect of consuming oxygen by the ultraviolet light quantum dots can be obtained. The content of the volatile solvent in the remaining in the wavelength conversion layer is preferably less than 0.2 mass %, and more preferably less than 0.1 parts by mass from the viewpoint of preventing a change in size of the wavelength conversion layer by volatilization over time or preventing damage of the wavelength conversion layer under the heating conditions and damage of a wavelength conversion member using the wavelength conversion layer.

The volatile solvent may be removed by heating, air drying or the like in a case where irradiation is performed with light having a wavelength equal to or shorter than near-ultraviolet light in the curing step. The drying temperature is 40° C. to 250° C. and particularly preferably 70° C. to 180° C. The drying temperature, the drying air quantity, and the drying time vary depending on the solvent to be used and can he appropriately selected according to the kind of solvent to be used and combination thereof.

A light source of the energy ray having a wavelength equal to or shorter than near-ultraviolet light is preferably a light source of ultraviolet light, and various mercury lamps of ultraviolet light, ultra-high pressure, high pressure, medium pressure, and low pressure, a chemical lamp, a carbon arc lamp, a metal halide lamp, a xenon lamp, sunlight, and the like can be used. Various available laser light source having a wavelength of 350 to 420 nm can be used by adopting multibeam irradiation and the like.

The polymerization by irradiation with the energy ray having a wavelength equal to or shorter than near-ultraviolet light can be performed in air or an inert gas. However, in a case of using a radial polymerizable compound, in order to reduce the induction period for polymerization, to sufficiently increase the polymerization rate, or the like, an atmosphere in which the oxygen concentration is lowered as much as much as possible is preferable. The irradiation intensity of ultraviolet light to be emitted is preferably about 0.1 to 1000 mW/cm$^2$ and the light irradiation dose on the surface of the precursor is 100 to 10000 mJ/cm$^2$. In addition, the temperature distribution of the precursor in the light irradiation step is preferably uniform and is more preferably controlled to be within ±3° C., and still more preferably controlled to be within ±1.5° C. In this range, the polymerization reaction uniformly proceeds in in-plane and in-layer depth directions of the precursor layer and thus this range is preferable.

The volatile solvent removal step may be completed only by the volatilization removal, but in a case where the volatile solvent removal step is not completely performed, the volatile solvent removal step can be completed by exposing the precursor layer or the cured layer thereof to light gain after the volatilization removal, polymerizing the remaining volatile solvent through a polymerization reaction, and making volatile solvent nonvolatile for removal. After the volatile solvent removal step is completed, the amount of the volatile solvent remaining with respect to 100 parts by mass of the obtained wavelength conversion layer is less than 0.2 parts by mass, more preferably 0.1 parts by mass or less, and still more preferably 0.05 parts by mass.

In addition, for the purpose of obtaining an even film thickness, imparting tensile strength, improving brittleness, and adjusting the physical properties of the surface, the web may be subjected to a stretching treatment or a width reduction treatment, an annealing treatment, a calender treatment, a corona treatment, an irradiation treatment with light or an energy ray, and the like.

Hereinafter, the configuration other than the wavelength conversion layer will be described.

<Barrier Film (Substrate)>

The barrier films 10 and 20 are films having a function of suppressing permeation of water and/or oxygen. In the embodiment, the barrier layers 12 and 22 are provided on the supports 11 and 21, respectively. In this configuration, due to the presence of the supports, the strength of the wavelength conversion member 1D is improved, and the films can be easily manufactured.

In the wavelength conversion members according to the embodiment, the barrier films 10 and 20 in which the barrier layers 12 and 22 are supported by the supports 11 and 21 are provided such that the barrier layers 12 and 22 are adjacent to both main surfaces of the wavelength conversion layer 30. However, the barrier layers 12 and 22 are not necessarily supported by the supports 11 and 21. In addition, in a case where the supports 11 and 21 have sufficient barrier properties, the barrier layers may include only the supports 11 and 21.

In addition, it is preferable that the wavelength conversion member includes the two barrier films 10 and 20, that is, the barrier layers are provided on both surfaces of the wavelength conversion layer 30, as in the embodiment. However, the wavelength conversion member may include one barrier film.

The total light transmittance of the barrier film in the visible range is 80% or higher and more preferably 90% or higher. The visible range refers to a wavelength range of 430 nm to 780 nm, and the total light transmittance refers to an average light transmittance value in the visible range.

The oxygen permeability of the barrier films 10 and 20 is preferably 1.00 cm$^3$/(m$^2$·day·atm) or lower. The oxygen permeability of the barrier film 10 and 20 is more preferably 0.10 cm$^3$/(m$^2$·day·atm) or lower, still more preferably 0.01 cm$^3$/(m$^2$·day·atm) or lower.

The barrier films 10 and 20 have not only a gas barrier function of blocking oxygen and a function of blocking water (water vapor). In the wavelength conversion member 1D, the moisture permeability (water vapor transmission rate) of the barrier film 10 and 20 is 0.10 g/(m$^2$·day·atm) or lower. The moisture permeability of the barrier film 10 and 20 is preferably 0.01 g/(m$^2$·day·atm) or lower.

(Support)

In the wavelength conversion member 1D, at least one main surface of the wavelength conversion layer 30 is supported by the support 11 or 21. Here, "main surface" refers to a surface (a front surface or a rear surface) of the wavelength conversion layer which is disposed on a visible side or a backlight side when the wavelength conversion member is used. The same can also be applied to main surfaces of other layers and members.

As in the embodiment, it is preferable that front and rear main surfaces of the wavelength conversion layer 30 are supported by the supports 11 and 21.

The average film thickness of the supports 11 and 21 is preferably 10 μm or more and 500 μm or less, more preferably 15 μm or more and 300 μm or less, and still more preferably 25 μm or more and 100 μm or less from the viewpoint of the impact resistance of the wavelength conversion member. In a case where the concentration of the quantum dots 30A and 30B included in the wavelength conversion layer 30 is reduced or a case where the thickness of the wavelength conversion layer 30 is reduced, it is necessary that the number of times where the excitation light passes through the wavelength conversion layer by providing means for increasing retroreflection of light, for example, a plurality of prism sheets in the retroreflecting member 2B of the backlight unit to maintain a display color of a LCD. Accordingly, since it is preferable that the absorbance of light of the supports 11 and 12 at a wavelength of 450 nm is low, from the viewpoint of suppressing a decrease in brightness, the average thickness of the supports 11 and 21 is preferably 40 μm or less and more preferably 25 μm or less.

In order to further reduce the concentration of the quantum dots 30A and 30B in the wavelength conversion layer 30 or to further reduce the thickness of the wavelength conversion layer 30, it is necessary to increase retroreflection of light. Accordingly, it is preferable that the support is a transparent support which is transparent to visible light. Here, "transparent to visible light" represents that the light transmittance in the visible range is 80% or higher and preferably 85% or higher. The light transmittance used as an index for transparency can be measured using a method described in JIS-K 7105. That is, using an integrating sphere light transmittance measuring device, the total light transmittance and the scattered light amount are measured, and the diffuse transmittance is subtracted from the total light transmittance to obtain the light transmittance. The details of the support can be found in paragraphs "0046" to "0052" of JP2007-290369A and paragraphs "0040" to "0055" of JP2005-096108A.

In addition, the in-plane retardation Re(589) of the supports 11 and 21 at a wavelength of 589 nm is preferably 1000 nm or lower, more preferably 500 nm or lower, and still more preferably 200 nm or lower.

When whether or not foreign matter or defects are present is inspected after the preparation of the wavelength conversion member 1D, foreign matter or defects can be easily found by disposing two polarizing plates at extinction positions and inserting the wavelength conversion member between the two polarizing plates to observe the wavelength conversion member. In a case where Re(589) of the support is in the above-described range, foreign matter or defects can be easily found during the inspection using the polarizing plates, which is preferable.

Here, Re(589) is measured using KOBRA 21ADH or WR (manufactured by Oji Scientific Instruments Co., Ltd.) by causing light at a wavelength of 589 nm to be incident in a film normal direction. The measurement wavelength $\lambda$ nm can be selected by manually changing a wavelength selective filter or changing a measured value using a program or the like.

As the supports 11 and 21, a support having barrier properties against oxygen and water is preferable. Preferable examples of the support include a polyethylene terephthalate film, a film which includes a polymer having a cyclic olefin structure, and a polystyrene film.

(Barrier Layer)

It is preferable that the support 11 or 21 includes the barrier layer 12 or 22 including at least one inorganic barrier layer 12b or 22b which is formed to be adjacent to a surface on the wavelength conversion layer 30 side.

As shown in FIG. 2, the barrier layer 12 or 22 may include at least one organic barrier layer 12a or 22a which is formed between the support 11 or 21 and the inorganic barrier layer 12b or 22b. The organic barrier layer 12a or 22a may be provided between the inorganic barrier layer 12b or 22b and the wavelength conversion layer 30. The organic barrier layer 12a or 22a may be provided as a third barrier layer between the inorganic barrier layer 22b and the wavelength conversion layer 30. The organic barrier layer closest to the wavelength conversion layer 30 side is called a barrier overcoat layer. From the viewpoint of improving weather fastness, it is preferable that a plurality of barrier layers are provided because barrier properties can be further improved. In addition, in the configuration where the barrier overcoat layer 22c is provided, an effect of improving scratch resistance of the barrier layer and an effect of improving peelability can be further obtained.

The barrier layer 12 or 22 is formed on a surface of the support 11 or 21. Accordingly, the barrier film 10 or 20 includes: the support 11 or 21; and the barrier layer 12 or 22 that is formed on the support 11 or 21. In a case where the barrier layer 12 or 22 is provided, it is preferable that the support has high heat resistance. In the wavelength conversion member 1D, a layer of the barrier film 10 or 20 which is adjacent to the wavelength conversion layer 30 may be an inorganic barrier layer or an organic barrier layer and is not particularly limited.

From the viewpoint of improving light resistance, it is preferable that the barrier layer 12 or 22 includes a plurality of layers because barrier properties can be further improved.

However, as the number of layers increases, the light transmittance of the wavelength conversion member is likely to decrease. Therefore, it is preferable that the barrier layer 12 or 22 is designed in consideration of excellent light transmittance and barrier properties.

[Inorganic Barrier Layer]

"Inorganic layer" is a layer including an inorganic material as a major component and is preferably a layer consisting only of an inorganic material.

The inorganic barrier layer 12b or 22b which is preferable for the barrier layer 12 or 22 is not particularly limited, and various inorganic compounds such as a metal, an inorganic oxide, an inorganic nitride, or an inorganic oxynitride can be used. As an element constituting the inorganic material, silicon, aluminum, magnesium, titanium, tin, indium, or cerium is preferable. The inorganic material may include one element or two or more elements among the above elements. Specific examples of the inorganic compound include silicon oxide, silicon oxynitride, aluminum oxide, magnesium oxide, titanium oxide, tin oxide, an indium oxide alloy, silicon nitride, aluminum nitride, and titanium nitride. In addition, as the inorganic barrier layer, a metal film such as an aluminum film, a silver film, a tin film, a chromium film, a nickel film, or a titanium film may be provided.

In particular, an inorganic barrier layer including a silicon oxide, a silicon nitride, a silicon carbide, or an aluminum oxide is preferable. The inorganic barrier layer formed of the above materials has excellent adhesiveness with the organic barrier layer. Therefore, in a case where a pin hole is formed on the inorganic barrier layer, the organic barrier layer can be effectively embedded in the pin hole, and barrier properties can be further suppressed.

In addition, it is more preferable that the inorganic barrier layer is formed of a silicon nitride from the viewpoint of suppressing light absorption in the barrier layer, A method of forming the inorganic barrier layer is not particularly limited. For example, various film forming methods in which a film forming material can be evaporated or scattered to be deposited on a deposition target surface can be used.

Examples of the method of forming the inorganic barrier layer include: a vacuum deposition method of heating and depositing an inorganic material such as an inorganic oxide, an inorganic nitride, an inorganic oxynitride, or a metal; an oxidation deposition method of introducing oxygen gas and oxidizing an inorganic material as a raw material for deposition; a sputtering method of introducing argon gas and oxygen gas and sputtering an inorganic material as a target material for deposition; a physical vapor deposition (PVD) method, such as an ion plating method, of heating an inorganic material with a plasma beam generated by a plasma gun for deposition; and in a case where a deposited film formed of silicon oxide is formed, a chemical vapor deposition method of using an organic silicon compound as a raw material.

The thickness of the inorganic barrier layer may be 1 nm to 500 nm and is preferably 5 nm to 300 nm and more preferably 10 nm to 150 nm. By adjusting the thickness of the adjacent inorganic layer to be in the above-described range, light absorption in the inorganic barrier layer can be suppressed while realizing excellent barrier properties, and the wavelength conversion member having a high light transmittance can be provided.

[Organic Barrier Layer]

"Organic layer" is a layer including an organic material as a major component in which the content of the organic material is preferably 50 mass % or higher, more preferably 80 mass % or higher, and still more preferably 90 mass % or higher. The details of the organic barrier layer can be found in paragraphs "0020" to "0042" of JP2007-290369A and paragraphs "0074" to "0105" of JP2005-096108A. It is preferable that the organic barrier layer includes a cardo polymer. As a result, adhesiveness between the organic barrier layer and an adjacent layer, in particular, adhesiveness between the organic barrier layer and the inorganic barrier layer is improved, and more favorable barrier properties can be realized. The details of the cardo polymer can be found in paragraphs "0085" to "0095" of JP2005-096108A. The thickness of the organic barrier layer is preferably in a range of 0.05 µm to 10 µm and more preferably in a range of 0.5 to 10 µm. In a case where the organic barrier layer is formed using a wet coating method, the thickness of the organic barrier layer is preferably in a range of 0.5 to 10 µm and more preferably in a range of 1 µm to 5 µm. In a case where the organic layer is formed using a dry coating method, the thickness of the organic layer is preferably in a range of 0.05 µm to 5 µm and more preferably in a range of 0.05 µm to 1 µm. By adjusting the thickness of the organic barrier layer, which is formed using a wet coating method or a dry coating method, adhesiveness with the inorganic layer can be further improved.

Other details of the inorganic barrier layer and the organic barrier layer can be found in JP2007-290369A, JP2005-096108A, and US2012/0113672A1.

(Design Change of Barrier Film)

In the wavelength conversion member 1D, the wavelength conversion layer, the inorganic barrier layer, the organic barrier layer, and the support may be laminated in this order. The support may be provided between the inorganic barrier layer and the organic barrier layer, between two organic barrier layers, or between two inorganic barrier layers.

(Unevenness Imparting Layer (Mat Layer))

It is preferable that the barrier film 10 or 20 includes an unevenness imparting layer (mat layer) which imparts an uneven structure to a surface of the barrier film 10 opposite to the wavelength conversion layer 30 side. In a case where the barrier film includes the mat layer, blocking properties and slipping properties of the barrier film can be improved, which is preferable. It is preferable that the mat layer is layer including particles. Examples of the particles include inorganic particles such as silica, alumina, a metal oxide and organic particles such as crosslinked polymer particles. In addition, it is preferable that the mat layer is provided on a surface of the barrier film opposite to the wavelength conversion layer. However, the mat layer may be provided on opposite surfaces of the barrier film.

(Pressure Sensitive Adhesive Layer)

The wavelength conversion member 1D which is manufactured using a second manufacturing method described below may include a pressure sensitive adhesive layer 50. The pressure sensitive adhesive layer 50 is not particularly limited, and examples thereof include a layer obtained by curing an adhesive. Various adhesives which are used for manufacturing a polarizing plate in the related art can be used as long as they are curable. From the viewpoints of weather fastness, polarizability, and the like, an adhesive which is curable by active energy rays such as ultraviolet light is preferable. Among the adhesives which are curable by active energy rays, an active energy ray-curable adhesive which includes, as one active energy ray-curable component, an epoxy compound, more specifically, an epoxy compound not having an aromatic ring in the molecule as described in JP2004-245925A is preferable. In addition, with the active energy ray-curable adhesive, not only a canonically polymerizable compound such as an epoxy compound as a representative example but also typically a polymerization initiator, in particular, a photocationic polymerization initiator for generating a cationic species or Lewis acid to initiate polymerization of the canonically polymerizable compound when irradiated with active energy rays are mixed. Further, various additives such as a thermal cationic polymerization initiator which initiates polymerization when heated or a photosensitizer may be mixed with the active energy ray-curable adhesive.

(Light Scattering Layer)

The wavelength conversion member 1D may have a light scattering function for efficiently extracting the fluorescence of the quantum dots to the outside. The light scattering function may be provided in the wavelength conversion layer 30, or a layer having a light scattering function may be separately provided as a light scattering layer.

The light scattering layer may be provided on a surface of the barrier layer 22 on the wavelength conversion layer 30 side, or may be provided on a surface of the support opposite to the wavelength conversion layer.

In a case where the mat layer is provided, it is preferable that the mat layer functions not only as an unevenness imparting layer but also as a light scattering layer.

[Backlight Unit]

Figure 3:
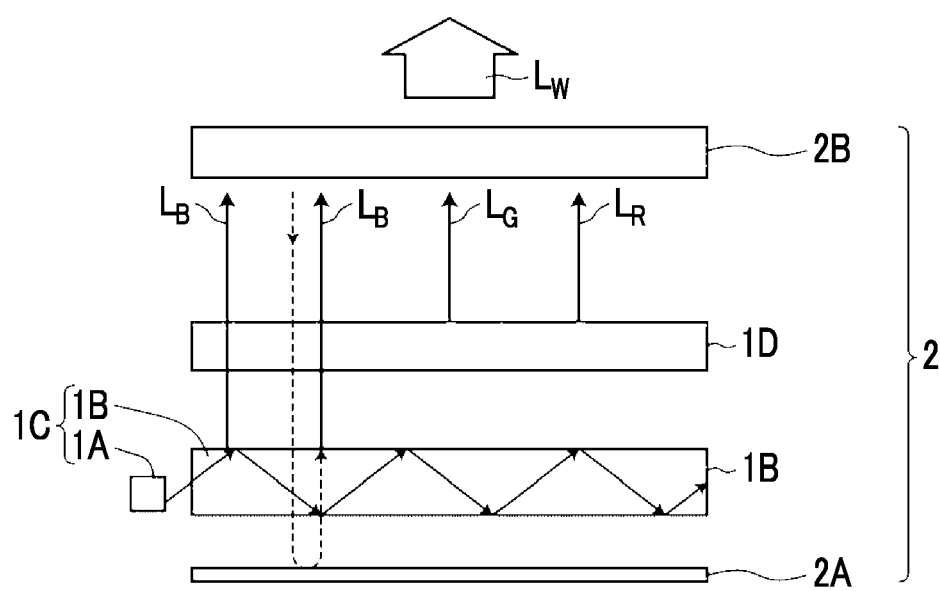
FIG. 3 is a cross-sectional view showing a schematic configuration of a backlight unit including the wavelength conversion member according to the embodiment of the present invention.

The wavelength conversion member according to the embodiment of the present invention and a backlight unit including the same will be described with reference to the drawing. FIG. 3 is a cross-sectional view showing a schematic configuration of the backlight unit including the wavelength conversion member according to the embodiment. In the drawings of the specification, a scale of each portion is appropriately changed and shown for facilitating visual observation. In the specification, a numerical range expressed by using "to" means a range including numeral values described before and after "to" as the lower limit and the upper limit.

As shown in FIG. 3, the backlight unit 2 shown in FIG. 1 includes: a surface light source 1C including a light source 1A, which emits primary light (blue light LB), and a light guide plate 1B which guides and emits the primary light emitted from the light source 1A; a wavelength conversion member 1D that is provided on the surface light source 1C; and a reflection plate 2A that is disposed to face the wavelength conversion member 1D with the surface light source 1C interposed therebetween. The wavelength conversion member 1D are excited by excitation light, which is at least a portion of the primary light LB emitted from the surface light source 1C, to emit fluorescence and emits secondary light (LG, LR) which includes the fluorescence and the primary light LB which passes through the wavelength conversion member 1D.

In FIG. 3, $L_B$, $L_G$, and $L_R$ emitted from the wavelength conversion member 1D are incident on the retroreflecting member 2B, and each incident light is repeatedly reflected between the retroreflecting member 2B and the reflection plate 2A and passes through the wavelength conversion member 1D multiple times. As a result, in the wavelength conversion member 1D, a sufficient amount of the excitation light (blue light $L_B$) is absorbed by quantum dots 30A and 30B in the wavelength conversion layer 30, a sufficient amount of fluorescence ($L_G$, $L_R$) is emitted, and white light $L_W$ is realized and emitted from the retroreflecting member 2B.

From the viewpoint of realizing high brightness and high color reproducibility, it is preferable that the backlight unit includes a multi-wavelength light source. For example, it is preferable that blue light having an emission peak wavelength in a wavelength range of 430 to 480 nm and having a full width at half maximum of emission peak of 100 nm or less, green light having an emission peak wavelength in a wavelength range of 500 to 600 nm and having a full width at half maximum of emission peak of 100 nm or less, and red light having an emission peak wavelength in a wavelength range of 600 to 680 nm and having a full width at half maximum of emission intensity peak of 100 nm or less are emitted.

From the viewpoint of further improving brightness and color reproducibility, the wavelength range of the blue light emitted from the backlight unit 2 is preferably 430 to 480 nm and more preferably 440 to 460 nm.

From the same viewpoint, the wavelength range of the green light emitted from the backlight unit 2 is preferably 520 to 560 nm and more preferably 520 to 545 nm.

In addition, from the same viewpoint, the wavelength range of the red light emitted from the backlight unit is preferably 600 to 680 nm and more preferably 610 to 640 nm.

In addition, from the same point, the full width at half maximum of the emission intensity of each of the blue light, the green light, and the red light emitted from the backlight unit is preferably 80 nm or less, more preferably 50 nm or less, still more preferably 40 nm or less, and still more preferably 30 nm or less. In particular, it is more preferable that the full width at half maximum of the emission intensity of the blue light is 25 nm or less.

The backlight unit 2 includes at least the wavelength conversion member 1D and the surface light source 1C. As the light source 1A, for example, a light source which emits blue light having an emission peak wavelength in a wavelength range of 430 nm to 480 nm, or a light source which emits ultraviolet light can be used. As the light source 1A, for example, a light emitting diode or a laser light source can be used.

As shown in FIG. 3, the surface light source 1C may include: the light source 1A; and the light guide plate 1B that guides and emits the primary light emitted from the light source 1A. Alternatively, the surface light source 1C may include: the light source 1A that is disposed along with a plane parallel to the wavelength conversion member 1D; and a diffusion plate 1E that is provided instead of the light guide plate 1B. The former surface light source is called an edge light mode, and the latter surface light source is called a direct backlight mode.

In the embodiment, the example in which the surface light source is used as the light source has been described. As the light source, a light surface other than the surface light source can also be used.

(Configuration of Backlight Unit)

In the above description regarding FIG. 3, the configuration of the backlight unit is an edge light mode including a light guide plate or a reflection plate as a component. However, the configuration of the backlight unit may be a direct backlight mode. As the light guide plate, a well-known light guide plate can be used without any particular limitation.

In addition, as the reflection plate 2A, a well-known reflection plate can be used without any particular limitation. The details of the reflection plate 2A can be found in JP3416302B, JP3363565B, JP4091978B, and JP3448626B, the contents of which are incorporated herein by reference.

The retroreflecting member 2B may be formed of a well-known diffusion plate, a diffusion sheet, a prism sheet (for example, BEF series, manufactured by Sumitomo 3M Ltd.), or a light guide. The configuration of the retroreflecting member 2B can be found in JP3416302B, JP3363565B, JP4091978B, and JP3448626B, the contents of which are incorporated herein by reference.

[Liquid Crystal Display Device]

Figure 4:
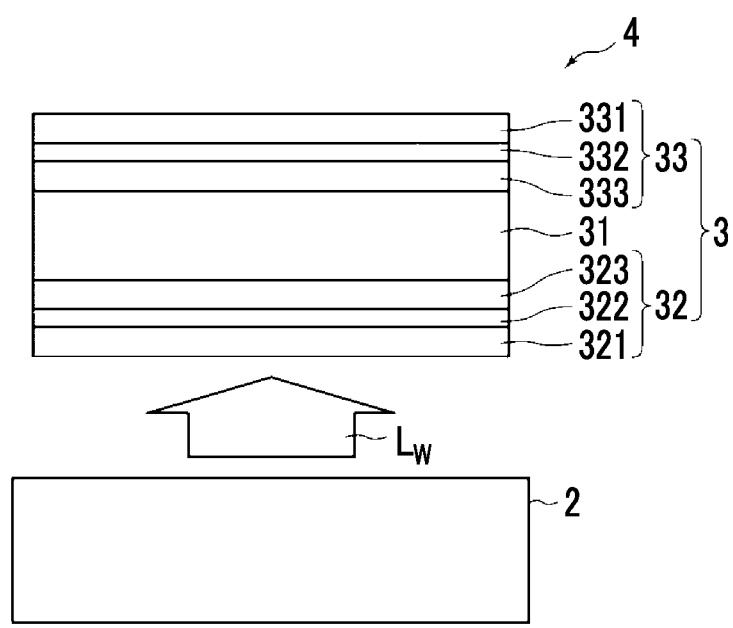
FIG. 4 is a cross-sectional view showing a schematic configuration of a liquid crystal display device including the backlight unit according to the embodiment of the present invention.

The above-described backlight unit 2 can be applied to a liquid crystal display device. As shown in FIG. 4, a liquid crystal display device 4 includes: the backlight unit 2 according to the embodiment; and a liquid crystal cell unit 3 which is disposed to face the retroreflecting member side of the backlight unit.

In the liquid crystal cell unit 3, as shown in FIG. 4, a liquid crystal cell 31 is interposed between polarizing plates 32 and 33. In the polarizing plates 32 and 33, opposite main surfaces of polarizers 322 and 332 are protected by polarizing plate protective films 321 and 323 and polarizing plate protective films 331 and 333, respectively.

Regarding each of the liquid crystal cell 31, the polarizing plates 32 and 33, and other components which constitute the liquid crystal display device 4, a product prepared using a well-known method or a commercially available product can be used without any particular limitation. In addition, of course, a well-known interlayer such as an adhesive layer can be provided between respective layers.

As a driving mode of the liquid crystal cell 31, various modes such as a twisted nematic (TN) mode, a super twisted nematic (STN) mode, a vertical alignment (VA) mode, an in-plane switching (IPS) mode, or an optically compensated bend (OCB) anode can be used without any particular limitation. The liquid crystal cell is preferably a VA mode, an OCB mode, an IPS mode, or a TN mode but is not limited thereto. Examples of the configuration of the VA mode liquid crystal display device include a configuration shown in FIG. 2 described in JP2008-262161A. However, a specific configuration of the liquid crystal display device is not particularly limited, and a well-known configuration can be adopted, Optionally, the liquid crystal display device 4 further includes an optical compensation member for optical compensation or a sub-functional layer such as an adhesive layer. Further, in addition to (or instead of) a color filter substrate, a thin film transistor substrate, a lens film, a diffusion sheet, a hard coat layer, an anti-reflection layer, a low-reflection layer, or an anti-glare layer, a surface layer such as a forward scattering layer, a primer layer, an antistatic layer, or a undercoat layer may be disposed.

The backlight-side polarizing plate 32 may include a phase difference film as the polarizing plate protective film 323 on the liquid crystal cell 31 side. As this phase difference film, for example, a well-known cellulose acylate film can be used.

The backlight unit 2 and the liquid crystal display device 4 includes the wavelength conversion member according to the present invention having a small light loss. Therefore, the backlight unit 2 and the liquid crystal display device 4 exhibit the same effects as those of the wavelength conversion member according to the present invention, in which peeling at an interface of the wavelength conversion layer including quantum dots is not likely to occur, the emission intensity is not likely to decrease, and the brightness is high.

"Design Change"

In the embodiment, the wavelength conversion layer (wavelength converter) includes the ultraviolet light quantum dots and/or oxides thereof. However, the wavelength converter formed by using the composition of the present invention may be provided to a part of the wavelength conversion layer. For example, oxidation of the visible light quantum dots can be suppressed by consuming oxygen permeated from the outside particularly at the time of using the wavelength conversion function by disposing the wavelength converter obtained using the composition of the present invention on the permeation path of oxygen from the outside such as the interface portion between the barrier layers 12 and 22 of the wavelength conversion layer including the visible light quantum dots and the end portion of the wavelength conversion layer. The shape of the wavelength converter is not particularly limited and can be appropriately selected from a block shape, a mesh shape, a layered shape, a capillary shape, a stripe pattern, or the like.

In a case where the wavelength conversion layer in which the wavelength converter is disposed is manufactured by disposing the wavelength converter after curing on the surface or inside of the wavelength conversion layer, it is difficult to expect the effect of consuming dissolved oxygen by the ultraviolet light quantum dots at the time of curing of the wavelength conversion layer, and the effect of consuming oxygen penetrated while being used is principal, in a case where a wavelength converter, which is not sufficiently cured, for example, is in a gel-like state or the like, is disposed to form a wavelength conversion layer, the effect of consuming dissolved oxygen at the time of curing of the wavelength conversion layer can be obtained.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples.

(Preparation of Barrier Film 10)

As a support, a polyethylene terephthalate (PET) film (trade name: COSMOSHINE (registered trademark) A4300, manufactured by Toyobo Co., Ltd.) having a thickness of 50 μm was used, and an organic layer and an inorganic layer were formed in this order on a single surface of the support in the following procedure. (Formation of Organic Layer)

Trimethylolpropane triacrylate (trade name "TMPTA", manufactured by Daicel-Cytec Co., Ltd.) and a photopolymerization initiator (trade name "ESACURE (registered trade mark) KTO46", manufactured by Lamberti S.p.A.) were prepared and were weighed such that a mass ratio thereof was 9.5:5. These components were dissolved in methyl ethyl ketone. As a result, a coating solution having a solid content concentration of 15% was obtained. This coating solution was applied to the PET film using a roll-to-roll method with a die coater and was allowed to pass through a drying zone at 50° C. for 3 minutes. Next, in a nitrogen atmosphere, the coating solution was irradiated with ultraviolet light (cumulative irradiation dose: about 600 mJ/cm$^2$) to be cured, and the PET film was wound. The thickness of the organic layer formed on the support was 1 μm.

(Formation of Inorganic Layer)

Next, using a CVD apparatus, an inorganic layer (silicon nitride layer) was formed on a surface of the organic layer. As raw material gases, silane gas (flow rate: 160 sccm), ammonia gas (flow rate: 370 sccm), hydrogen gas (flow rate: 590 sccm), and nitrogen gas (flow rate: 240 sccm) were used. As a power supply, a high-frequency power supply having a frequency of 13.56 MHz was used. The film forming pressure was 40 Pa, and the achieved thickness was 50 nm. In this way, a film in which the inorganic layer was laminated on the surface of the organic layer formed on the support was prepared.

(Preparation of Barrier Overcoat Layer)

A urethane skeleton acrylic polymer (ACRYD 8BR 500, manufactured by Taisei Fine Chemical Co., Ltd.) and a photopolymerization initiator (IRAGACURE 184, manufactured by BASF SE) were weighed such that a mass ratio thereof was 95:5. and these components were dissolved in methyl ethyl ketone. As a result, a coating solution having a solid content concentration of 15% was prepared and used as a coating solution for a first barrier overcoat layer.

The prepared coating solution for a barrier overcoat layer was applied to the surface of the inorganic layer of the barrier film using a roll-to-roll method with a die coater and was allowed to pass through a drying zone at 100° C. for 3 minutes to form an overcoat layer. Then, the laminate was wounded to prepare a barrier film 10 with the overcoat layer. The thickness of the overcoat layer formed on the support was 1 μm.

<Preparation of Barrier Film 101>

—Preparation of Light Scattering Layer Forming Polymerizable Composition—

As light scattering particles, 150 g of silicone resin particles (trade name "TOSPEARL 120", manufactured by Momentive Performance Materials Inc., an average particle size of 2.0 μm) and 40 g of polymethyl methacrylate (PMMA) particles (TECHPOLYMER manufactured by SEKISUI CHEMICAL Co., LTD., an average particle size of 8 μm) were stirred in 550 g of methyl isobutyl ketone (MIBK) first for approximately 1 hour, and were dispersed, and thus, a dispersion liquid was obtained, 50 g of an acrylate-based compound (Viscoat 700HV manufactured by Osaka Organic Chemical Industry, Ltd.) and 40 g of an acrylate-based compound (trade name "8BR500", manufactured by TAISEI FINE CHEMICAL CO., LTD.) were added to obtained dispersion liquid, and the materials were further stirred. 1.5 g of a photopolymerization initiator (trade name "IRGACURE (registered trademark) 819", manufactured by BASF SE) and 0.5 g of a fluorine-based surfactant (trade name "FC4430", manufactured by 3M Company) were further added, and thus, a coating liquid (a polymerizable composition for forming a light scattering layer) was prepared.

—Application and Curing of Polymerizable Composition for Forming Light Scattering Layer—

The coating solution was applied with a die coater such that the surface of the PET film of the barrier film 10 became a coating surface. A wet coating amount was adjusted by a feed pump, and coating was performed in a coating amount of 25 cc/m$^2$ (the thickness was adjusted to be approximately 12 μm in a dried film). After the film passed through a drying zone at 60° C. for 3 minutes, the film was wound around a backup roll of which the temperature was adjusted to 30° C., was cured with an ultraviolet ray of 600 mJ/cm$^2$, and then, was wound. Thus, a light scattering layer laminated barrier film 101 was obtained.

<Preparation of Barrier Film 102>

—Preparation of Polymerizable Composition for Forming Mat Layer—

As particles for forming unevenness of a mat layer, 190 g of silicone resin particles (trade name "TOSPEARL 2000b", manufactured by Momentive Performance Materials Inc., an average particle size of 6.0 μm) were stirred in 4700 g of methyl ethyl ketone (MEK) first for approximately 1 hour, and were dispersed, and thus, a dispersion liquid was obtained. 430 g of an acrylate-based compound (trade name "A-DPH", manufactured by Shin Nakamura Chemical Co., Ltd.), 800 g of an acrylate-based compound (trade name "8BR930", manufactured by TAISEI FINE CHEMICAL CO., LTD.) were added to the obtained dispersion liquid and the materials were further stirred. 40 g of a photopolymerization initiator (trade name "IRGACURE BASF (registered trademark) 184", manufactured by BASF SE) was added and thus a coating solution was prepared.

—Application and Curing of Polymerizable Composition for Forming Mat Layer—

The coating solution was applied with a die coater such that the surface of the PET film of the barrier film 10 became a coating surface. A wet coating amount was adjusted by a feed pump, and coating was performed in a coating amount of 10 cc/m$^2$. The prepared coating solution was allowed to pass through a drying zone at 80° C. for 3 minutes and then the layer was wounded around a backup roll of which the temperature was adjusted to 30° C., was cured with an ultraviolet ray of 600 mJ/cm$^2$, and then, was wound. A mat layer formed after curing had a thickness of about 3 to 6 μm and a surface roughness in which the maximum cross section height Rt (measured in accordance to JIS B0601) was about 1 to 3 μm. Thus, an uneven layer laminated barrier film 1-B was obtained. In the same way, an uneven layer laminated barrier film 102 was obtained.

<Preparation of Polymer Molding Composition>

A composition having the following composition was prepared, was filtered through a polypropylene filter having a pore diameter of 0.2 μm, and then was dried for 30 minutes under reduced pressure to prepare polymer molding compositions 1 to 6. In the following description, for a toluene dispersion liquid of ultraviolet emission quantum dots 1 having a maximum light emission wavelength of 375 nm, CS360-10 manufactured by NN-LABS, LLC. was used, for a toluene dispersion liquid of green quantum dots 2 having an emission peak wavelength of 535 nm, CZ520-100 manufactured by NN-LABS, LLC. was used, and for a toluene dispersion liquid of red quantum dots 3 having an emission peak wavelength of 630 nm, CZ620-100 manufactured by NN-LABS, LLC. was used. CS360-10 is a quantum dot formed of CdS and using oleic acid as a ligand, and is dispersed in toluene at a concentration of 3 weight %. Both CZ520-100 and CZ620-100 are quantum dots containing CdSe as a core, ZnS as a shell, and octadecyl amine as a ligand, and are dispersed in toluene at a concentration of 3 weight %.

In addition, for a toluene dispersion liquid of green quantum dots 4 having an emission peak wavelength of 530 nm, INP530-25 manufactured by NN-LABS, LLC. was used, and for a toluene dispersion liquid of red quantum dots 5 having an emission peak wavelength of 620 nm, INP620-25 manufactured by NN-LABS, LLC. was used. Both INP530-25 and INP620-25 are quantum dots containing InP as a core, ZnS as a shell, and octadecyl amine as a ligand, and are dispersed in a concentration of 3 weight %.

Polymer Molding Composition 1

| | |
|---|---|
| Toluene dispersion liquid of quantum dots 1 (emission peak wavelength: 375 nm) | 20 parts by mass |
| Toluene dispersion liquid of quantum dots 2 (emission peak wavelength: 535 nm) | 20 parts by mass |
| Toluene dispersion liquid of quantum dots 3 (emission peak wavelength: 630 nm) | 2 parts by mass |
| Lauryl methacrylate | 92.7 parts by mass |
| Trimethylol propane triacrylate | 5 parts by mass |
| Photopolymerization initiator (IRGACURE 819 (manufactured by BASF SE)) | 1 part by mass |

Polymer Molding Composition 2

| | |
|---|---|
| Toluene dispersion liquid of quantum dots 1 (emission peak wavelength: 375 nm) | 20 parts by mass |
| Toluene dispersion liquid of quantum, dots 2 (emission peak wavelength: 535 nm) | 20 parts by mass |
| Toluene dispersion liquid of quantum dots 3 (emission peak wavelength: 630 nm) | 2 parts by mass |
| Alicyclic epoxy compound I | 95.7 parts by mass |
| Photopolymerization initiator (IRGACURE 290 (manufactured by BASF SE)) | 3 parts by mass |

Polymer Molding Composition 3

| | |
|---|---|
| Toluene dispersion liquid of quantum, dots 1 (emission peak wavelength: 375 nm) | 20 parts by mass |
| Toluene dispersion liquid of quantum dots 4 (emission peak wavelength: 530 nm) | 20 parts by mass |
| Toluene dispersion liquid of quantum dots 5 (emission peak wavelength: 620 nm) | 2 parts by mass |
| Alicyclic epoxy compound I | 95.7 parts by mass |
| Photopolymerization initiator (IRGACURE 290 (manufactured by BASF SE)) | 3 parts by mass |

Polymer Molding Composition 4

| | |
|---|---|
| Toluene dispersion liquid of quantum dots 2 (emission peak wavelength: 535 nm) | 20 parts by mass |
| Toluene dispersion liquid of quantum dots 3 (emission peak wavelength: 630 nm) | 2 parts by mass |
| Lauryl methacrylate | 93.3 parts by mass |
| Trimethylol propane triacrylate | 5 parts by mass |
| Photopolymerization initiator (IRGACURE 819 (manufactured by BASF SE)) | 1 part by mass |

Polymer Molding Composition 5

| | |
|---|---|
| Toluene dispersion liquid of quantum dots 2 (emission peak wavelength: 535 nm) | 20 parts by mass |
| Toluene dispersion liquid of quantum dots 3 (emission peak wavelength: 630 nm) | 2 parts by mass |
| Alicyclic epoxy compound I | 96.3 parts by mass |
| Photopolymerization initiator (IRGACURE 290 (manufactured by BASF SE)) | 3 parts by mass |

Polymer Molding Composition 6

| | |
|---|---|
| Toluene dispersion liquid of quantum dots 4 (emission peak wavelength: 530 nm) | 20 parts by mass |
| Toluene dispersion liquid of quantum dots 5 (emission peak wavelength: 620 nm) | 2 parts by mass |
| Alicyclic epoxy compound I | 96.3 parts by mass |
| Photopolymerization initiator (IRGACURE 290 (manufactured by BASF SE)) | 3 parts by mass |

<Preparation of Wavelength Conversion Member(Examples 1 and 2 and Comparative Examples 1 and 2)>

The barrier film 102 was prepared and the polymer molding composition in each example shown in Table 1 was applied to the surface of the barrier overcoat layer using a die coater while being continuously transported at 1 m/min with a tension of 60 N/m. As a result, a coating film having a thickness of 50 µm was formed. Next, the barrier film in which the coating film was formed was wound around the backup roller, and the barrier film 101 was laminated on the coating film such that the barrier overcoat layer faced the coating film. Then, the laminate was wound around the backup roller in a state where the coating film was interposed between the barrier films and was irradiated with ultraviolet light while being continuously transported.

The diameter ϕ of the backup roller was 300 mm, and the temperature of the backup roller was 50° C. The irradiation dose of ultraviolet light was 2000 mJ/cm². In addition, the distance L1 from the backup roller to the laminate position was 50 mm, the distance L2 from the laminate roller to the backup roller was 1 mm, and the distance L3 from the laminate position to the light irradiation position was 50 mm The coating film was cured by irradiation with ultraviolet light to form a cured layer (wavelength conversion layer). As a result, a laminated film (wavelength conversion member) was manufactured. The thickness of the cured layer in the laminated film was 50±2 µm. The thickness accuracy of the cured layer was excellent at ±4%. In addition, wrinkling was not observed on the laminated film.

Evaluation
<Measurement of Brightness>
A commercially available tablet terminal (trade name "Kindle (registered trademark) Fire HDX 7", manufactured by Amazon.com Inc., hereinafter, also simply referred to as Kindle Fire HDX 7) including blue light as a backlight unit was disassembled to extract the backlight unit. Instead of the wavelength conversion film QDEF (Quantum Dot Enhancement Film) which had been assembled to the backlight unit, the wavelength conversion member of each of Examples and. Comparative Examples cut into a rectangular shape was assembled into the backlight unit. In this way, a liquid crystal display device was prepared. The prepared liquid crystal display device was turned on and the entire surface was turned into white display. Then the brightness was measured using a brightness meter (trade name "SR3", manufactured by TOPCON Corporation) provided at a distance of 520 mm perpendicular to the surface of the light guide plate. The brightness Y was evaluated based on the following evaluation standards. The measurement results are shown in Table 1.

<Evaluation of Brightness Deterioration (Decrease of Emission Intensity)>
In a room held at 25° C. and 60% RH, the wavelength conversion member according to each example was placed on a commercially available blue light source (OPSM-H150X142B, manufactured by OPTEX FA Co., Ltd.), and was continuously irradiated with blue light for 100 hours. Then, in the same manner, the wavelength conversion member was mounted on Kindle Fire HDX 7 to measure the brightness.

The brightness deterioration was measured based on the following evolution standards. The measurement results are shown in Table 1.

<Evaluation Standards>
A: A decrease in emission intensity after durability test is less than 15%.
B: A decrease in emission intensity after durability test is 15% or more and less than 30%.
C: A decrease in emission intensity after durability test is 30% or more and less than 50%.
D: A decrease in emission intensity after durability test is 50% or more.

In Table 1, the composition of the composition used for forming the wavelength conversion layer and the evaluation results of Examples 1 to 3 and Comparative Examples 1 to 3 of the present invention are shown.

As shown in Table 1, the effectiveness of the present invention was shown.

TABLE 1

| | | Polymer molding composition | | |
| --- | --- | --- | --- | --- |
| | | Quantum dot dispersion liquid (quantum dot content: 3 mass %) | | |
| | Polymer molding composition No. | Ultraviolet light quantum dot dispersion liquid (emission peak wavelength: 375 nm) | Visible light quantum dot (green) | Visible light quantum dot (red) |
| Example 1 | 1 | Toluene dispersion liquid of quantum dots 1 20 parts by mass (quantum dot: 0.6 parts by mass) | Toluene dispersion liquid of quantum dots 2 20 parts by mass (quantum dot: 0.6 parts by mass) | Toluene dispersion liquid of quantum dots 3 2 parts by mass (quantum dot: 0.06 parts by mass) |
| Example 2 | 2 | Toluene dispersion liquid of quantum dots 1 20 parts by mass (quantum dot: 0.6 parts by mass) | Toluene dispersion liquid of quantum dots 2 20 parts by mass (quantum dot: 0.6 parts by mass) | Toluene dispersion liquid of quantum dots 3 2 parts by mass (quantum dot: 0.06 parts by mass) |
| Example 3 | 3 | Toluene dispersion liquid of quantum dots 1 20 parts by mass (quantum dot: 0.6 parts by mass) | Toluene dispersion liquid of quantum dots 4 20 parts by mass (quantum dot: 0.6 parts by mass) | Toluene dispersion liquid of quantum dots 5 2 parts by mass (quantum dot: 0.06 parts by mass) |
| Comparative Example 1 | 4 | — | Toluene dispersion liquid of quantum dots 2 20 parts by mass (quantum dot: 0.6 parts by mass) | Toluene dispersion liquid of quantum dots 3 2 parts by mass (quantum dot: 0.06 parts by mass) |
| Comparative Example 2 | 5 | — | Toluene dispersion liquid of quantum dots 2 20 parts by mass (quantum dot: 0.6 parts by mass) | Toluene dispersion liquid of quantum dots 3 2 parts by mass (quantum dot: 0.06 parts by mass) |

TABLE 1-continued

| | | | | | | Brightness |
|---|---|---|---|---|---|---|
| Comparative Example 3 | 6 | — | Toluene dispersion liquid of quantum dots 4 20 parts by mass (quantum dot: 0.6 parts by mass) | Toluene dispersion liquid of quantum dots 5 2 parts by mass (quantum dot: 0.06 parts by mass) | | |

| | Polymer molding composition | | | | Evaluation | |
|---|---|---|---|---|---|---|
| | Polymer molded product raw material | | | | | Brightness |
| | Binder precursor | | Initiator | | Brightness | resistance |
| | Compound name | Content | Compound name | Content | (Cd/m$^2$) | deterioration |
| Example 1 | LMA TMPTA | 92.7 parts by mass 5.0 parts by mass | IRGACURE 819 | 1.0 parts by mass | 513 | B |
| Example 2 | Alicyclic epoxy compound | 95.7 parts by mass | IRGACURE 290 | 3.0 parts by mass | 501 | A |
| Example 3 | Alicyclic epoxy compound | 95.7 parts by mass | IRGACURE 290 | 3.0 parts by mass | 467 | B |
| Comparative Example 1 | LMA TMPTA | 93.3 parts by mass 5.0 parts by mass | IRGACURE 819 | 1.0 parts by mass | 449 | D |
| Comparative Example 2 | Alicyclic epoxy compound | 96.3 parts by mass | IRGACURE 290 | 3.0 parts by mass | 436 | C |
| Comparative Example 3 | Alicyclic epoxy compound | 96.3 parts by mass | IRGACURE 290 | 3.0 parts by mass | 347 | D |

EXPLANATION OF REFERENCES

1C: surface light source
1D: wavelength conversion member
2: backlight unit
2A: reflection plate
3: liquid crystal cell unit
4: liquid crystal display device
10, 20: barrier film
11, 21: substrate
12, 22: barrier layer
13: unevenness imparting layer (mat layer, light diffusion layer)
30: wavelength conversion layer
30A, 30B: quantum dots having emission peak wavelength in visible light region
30UV: quantum dots having emission peak wavelength in ultraviolet region or in near-ultraviolet region
30P: polymer matrix
30M: polymer molded product raw material
30L: polymer molding composition (composition)

What is claimed is:

1. A composition comprising at least:
quantum dots having an emission peak wavelength in a visible light region; and
quantum dots having an emission peak wavelength in an ultraviolet region or in a near-ultraviolet region.

2. The composition according to claim 1,
wherein the quantum dots having an emission peak wavelength in an ultraviolet region or in a near-ultraviolet region are quantum dots having an emission peak wavelength in a wavelength region of less than 430 nm.

3. The composition according to claim 1,
wherein the quantum dots having an emission peak wavelength in a visible light region are at least one kind of quantum dots selected from quantum dots having an emission peak wavelength in a wavelength range of 600 nm to 680 nm, quantum dots having an emission peak wavelength in a wavelength range of 520 nm to 560 nm, or quantum dots having an emission peak wavelength in a wavelength range of 430 nm to 480 nm.

4. A polymer molding composition comprising:
the composition according to claim 1; and
a polymer molded product raw material.

5. The polymer molding composition according to claim 4,
wherein the polymer molded product raw material includes a polymerizable binder precursor.

6. The polymer molding composition according to claim 4,
wherein the polymer molded product raw material is cured by exposure to light having a wavelength in an ultraviolet region or in a near-ultraviolet region.

7. The polymer molding composition according to claim 4,
wherein the polymer molded product raw material includes a binder.

8. The polymer molding composition according to claim 4,
wherein the polymer molded product raw material includes a volatile solvent.

9. A wavelength converter that is formed by curing the polymer molding composition according to claim 4.

10. A wavelength conversion member comprising:
a wavelength conversion layer including the wavelength converter according to claim 9.

11. A wavelength converter comprising, in a polymer:
quantum dots having an emission peak wavelength in a visible light region;
quantum dots having an emission peak wavelength in an ultraviolet region or in a near-ultraviolet region; and
an oxide formed by oxidizing at least a part of the quantum dots having an emission peak wavelength in an ultraviolet region or in a near-ultraviolet region.

12. A wavelength conversion member comprising:
a wavelength conversion layer including the wavelength converter according to claim 11.

13. The wavelength conversion member according to claim 12, further comprising:
a barrier film having an oxygen permeability of 1.00 $cm^3/(m^2 \cdot day \cdot atm)$ or lower wherein the barrier film is provided to be adjacent to at least one main surface of the wavelength conversion layer.

14. The wavelength conversion member according to claim 13,
wherein the barrier film is provided to be adjacent to two main surfaces of the wavelength conversion layer.

15. A backlight unit comprising:
a light source; and
the wavelength conversion member according to claim 12.

16. A liquid crystal display device comprising:
the backlight unit according to claim 15; and
a liquid crystal cell.

* * * * *